(12) United States Patent
Shen et al.

(10) Patent No.: US 7,197,690 B2
(45) Date of Patent: Mar. 27, 2007

(54) BANDWIDTH EFFICIENT CODED MODULATION SCHEME BASED ON MLC (MULTI-LEVEL CODE) SIGNALS HAVING MULTIPLE MAPS

(75) Inventors: Ba-Zhong Shen, Irvine, CA (US); Hau Thien Tran, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 96 days.

(21) Appl. No.: 11/017,087

(22) Filed: Dec. 20, 2004

(65) Prior Publication Data

US 2005/0149843 A1    Jul. 7, 2005

Related U.S. Application Data

(63) Continuation-in-part of application No. 10/669,066, filed on Sep. 23, 2003, now Pat. No. 7,139,964, and a continuation-in-part of application No. 10/264,486, filed on Oct. 4, 2002, now Pat. No. 7,093,187.

(60) Provisional application No. 60/535,485, filed on Jan. 10, 2004, provisional application No. 60/478,690, filed on Jun. 13, 2003, provisional application No. 60/384,698, filed on May 31, 2002.

(51) Int. Cl.
   *H03M 13/03* (2006.01)

(52) U.S. Cl. ............... 714/792; 714/796; 714/794; 714/800; 375/262; 375/341; 375/265

(58) Field of Classification Search ........ 714/789–790, 714/794, 795, 755, 758, 786, 792; 375/262, 375/265, 341
See application file for complete search history.

(56) References Cited

U.S. PATENT DOCUMENTS 3,542,756 A    11/1970    Gallager (Continued)

FOREIGN PATENT DOCUMENTS

EP    0 998 087 A1    5/2000

(Continued)

OTHER PUBLICATIONS

Narayanaswami 'Coded Modulation With Low Density Parity Check Codes,' Jun. 2001, pp. 1-77.*

(Continued)

*Primary Examiner*—Guy J. Lamarre
(74) *Attorney, Agent, or Firm*—Garlick Harrison & Markison; Shayne X. Short

(57) ABSTRACT

Bandwidth efficient coded modulation scheme based on MLC (Multi-Level Code) signals having multiple maps. The use of multiple maps is adapted to various types of coded signals including multi-level LDPC coded modulation signals and other MLC signals to provide for a significant performance gain in the continual effort trying to reach towards Shannon's limit. In the instance of LDPC coded signals, various level LDPC codewords are generated from individual corresponding LDPC encoders. These various level LDPC codewords are arranged into a number of sub-blocks. Encoded bits from multiple level LDPC codewords within each of the sub-blocks are arranged to form symbols that are mapped according to at least two modulations. Each modulation includes a constellation shape and a corresponding mapping. This use of multiple mappings provides for improved performance when compared to encoders that employ only a single mapping.

23 Claims, 19 Drawing Sheets

U.S. PATENT DOCUMENTS

| | | | |
|---|---|---|---|
| 3,665,396 | A | 5/1972 | Forney, Jr. |
| 4,295,218 | A | 10/1981 | Tanner |
| 5,949,796 | A * | 9/1999 | Kumar ................... 370/529 |
| 6,430,233 | B1 | 8/2002 | Dillon et al. |
| 6,473,010 | B1 | 10/2002 | Vityaev et al. |
| 6,567,465 | B2 | 5/2003 | Goldstein et al. |
| 6,633,856 | B2 | 10/2003 | Richardson et al. |
| 2003/0104788 | A1 | 6/2003 | Kim |
| 2003/0203721 | A1 | 10/2003 | Berezdivin et al. |
| 2004/0255228 | A1 | 12/2004 | Shen et al. |

FOREIGN PATENT DOCUMENTS

| | | |
|---|---|---|
| EP | 1 367 758 A2 | 12/2003 |
| EP | 1 379 001 A2 | 7/2004 |
| EP | 1 494 359 A2 | 1/2005 |

OTHER PUBLICATIONS

R. Gallager, Low-Density Parity-Check Codes, Cambridge, MA: MIT Press, 1963.

M. Luby, M. Mitzenmacher, A. Shokrollahi, D. Spielman, and V. Stemann, "Practical loss-resilient codes," 1997.

T. J. Richardson and R. L. Urbanke, "The capacity of low-density parity-check code under message-passing decoding," IEEE Trans. Inform. Theory, vol. 47, pp. 599-618, Feb. 2001.

E. Eleftheriou and S. Olcer, "Low-Density Parity-Check Codes for Digital Subscriber Lines," 0-7803-7400-2/02, IEEE, 2002, pp. 1752-1757.

H. Imai and S. Hirakawa," A new multilevel coding method using error correcting codes," IEEE Trans. Inform. Theory, vol. IT-23, pp. 371-377, May 1977.

G. Ungerboeck, "Channel coding with multilevel/phase signals," IEEE Trans. Inform. Theory, vol. IT-28, pp. 55-67, Jan. 1982.

U. Wachsmann, R.F.H. Fischer and J.B. Huber, "Multilevel codes: theoretical concepts and practical design rules," IEEE Trans. Inform. Theory, vol. 45, pp. 1361-1391, Jul. 1999.

T. Woerz and J. Hagenauer, "Iterative decoding for multilevel codes using reliability information," in Proc. IEEE Global Telecoms. Conf. (GLOBECOM) (Orlando, FL, Dec. 1992).

P. A. Martin and D.P. Taylor, "On multilevel codes and iterative multistage decoding," IEEE Trans. Inform. Theory, vol. 47, pp. 1916-1925, Nov. 2001.

G. Caire, G. Taricoo, and E. Biglien, "Bit-interleaved coded modulation," IEEE Trans. Inform. Theory, vol. 44, pp. 927-946, May 1998.

Ravi Narayanaswami, "Coded Modulation with low density parity check codes", Thesis submitted to the office of Graduate Studies of Texas A&M University in partial fulfillment of the requirements for the degree of Master of Science, Jun. 2001, pp. 1-77, USA.

Yu Yi and Moon Ho Lee, "Semi-Algebraic Low-Density Parity-Check (SA-LDPC) Codes for Bandwidth Efficient Modulation", 3rd International Symposium on Turbo Codes and Related Topics, Sep. 4, 2003, pp. 379-382, Brest, France.

Jun Tan and Gordon L. Stuber, "Analysis and Design of Interleaver Mappings for Iteratively Decoded BICM", IEEE International Conference on Communications. Conference, Apr. 28, 2002, vol. 1 of 5, pp. 1403-1407, New York, NY.

J. Hou, P.H. Siegel, L.B. Milsten and H.D. Pfister, "Capacity-approaching bandwidth efficient coded modulation schemes based on low-density parity-check codes," IEEE Trans. Inform. Theory, vol. 49, pp. 2141-2155, Sep. 2003.

Hu X-Y et al, "Efficient Implementations of the Sum-Product algorithm for Decoding LDPC Codes", IEEE Global Telecommunications Conference, GLOBECOM 2001, Nov. 25, 2001, pp. 1036-1036E, San Antonio, Texas.

Brink Ten S et al, "Design of Repeat-Accumulate Codes for Iterative Detection and Decoding", IEEE Transactions on Signal Processing, vol. 51, No. 11, Nov. 2003, pp. 2764-2772, New York, USA.

Patrick Robertson, "An Overview of Bandwidth Efficient T.urbo Coding Schemes", International Symposium On Turbo Codes, 1997, pp. 103-110, Brest, France.

Kou T et al: "Low-density parity-check codes based on finite geometrics; A rediscovery and new results" IEEE Transactions on Information Theory, vol. 47, No. 7, Nov. 2001.

Moe Wheatley, "WinPSK Technical Reference Manual", 46 pages, Dec. 28, 1999.

* cited by examiner

BANDWIDTH EFFICIENT CODED MODULATION SCHEME BASED ON MLC (MULTI-LEVEL CODE) SIGNALS HAVING MULTIPLE MAPS

CROSS REFERENCE TO RELATED PATENTS/PATENT APPLICATIONS

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:
1. U.S. Provisional Application Ser. No. 60/535,485, "Bandwidth efficient coded modulation scheme based on multi-level code, multiple signal mapping, and IPHD (Iterative Parallel Hybrid Decoding)," filed Friday, Jan. 10, 2004, pending.

CIP of BP3036

The present U.S. Utility Patent Application also claims priority pursuant to 35 U.S.C. § 120, as a continuation-in-part (CIP), to the following U.S. Utility Patent Application which is hereby incorporated herein by reference in its entirety and made part of the present U.S. Utility Patent Application for all purposes:
1. U.S. Utility patent application Ser. No. 10/669,066, entitled "Variable modulation with LDPC (Low Density Parity Check) coding," filed Sep. 23, 2003, now U.S. Pat. No. 7,139,964 which claims prority pursuant to 35 U.S.C. § 119(e) to the following U.S. Provisional Patent Application which is hereby incorporated herein by reference in its entirety and made part of the present U.S. Utility Patent Application for all purposes:
    a. U.S. Provisional Application Ser. No. 60/478,690, "Coded modulation with LDPC (Low Density Parity Check) code using variable maps and metric updating," filed Jun. 13, 2003.

CIP of BP2333

The present U.S. Utility Patent Application also claims priority pursuant to 35 U.S.C. § 120, as a continuation-in-part (CIP), to the following U.S. Utility Patent Application which is hereby incorporated herein by reference in its entirety and made part of the present U.S. Utility Patent Application for all purposes:
1. U.S. Utility application Ser. No. 10/264,486, entitled "Variable code rate and signal constellation turbo trellis coded modulation codec," filed Oct. 4, 2002, now U.S. Pat. No. 7,093,187 which claims priority pursuant to 35 U.S.C. § 119(e) to the following U.S. Provisional Patent Application which is hereby incorporated herein by reference in its entirety and made part of the present U.S. Utility Patent Application for all purposes:
    a. U.S. Provisional Patent Application Ser. No. 60/384,698, entitled "Variable code rate and signal constellation turbo trellis coded modulation codec," filed May 31, 2002).

Incorporation by Reference (Filed Concurrently)

The following U.S. Utility Patent Application, being filed concurrently, is hereby incorporated herein by reference in its entirety and made part of the present U.S. Utility Patent Application for all purposes:

BP4014

1. U.S. Utility patent application Ser. No. 11/017157 entitled "IPHD (Iterative Parallel Hybrid Decoding) of various MLC (Multi-Level Code) signals," filed Dec. 20, 2004, pending.

Other Incorporation by Reference (Filed Previously)

The following U.S. Utility Patent Applications are also hereby incorporated herein by reference in their entirety and made part of the present U.S. Utility Patent Application for all purposes:

BP1425.4

1. U.S. Utility patent application Ser. No. 09/952,210, entitled "METHOD AND APPARATUS FOR MIN* CALCULATION IN A MAP DECODER," filed Sep. 12, 2001, pending.

BP2480

2. U.S. Utility patent application Ser. No. 10/335,702, entitled "Single stage implementation of min*, max*, min and/or max to perform state metric calculation in SISO decoder," filed Jan. 2, 2003, pending, which claims priority pursuant to 35 U.S.C. § 119(e) to the following U.S. Provisional Patent Application which is hereby incorporated herein by reference in its entirety and made part of the present U.S. Utility Patent Application for all purposes:
    a. U.S. Provisional Application Ser. No. 60/427,979, "Single stage implementation of min*, max*, min and/or max to perform state metric calculation in SISO decoder," filed Nov. 20, 2002.

BP2541

3. U.S. Utility patent application Ser. No. 10/347,732, entitled "Inverse function of min*: min*-(inverse function of max*: max*-)," filed Jan. 21, 2003, pending, which claims priority pursuant to 35 U.S.C. § 119(e) to the following U.S. Provisional Patent Applications which are hereby incorporated herein by reference in their entirety and made part of the present U.S. Utility Patent Application for all purposes:
    a. U.S. Provisional Application Ser. No. 60/403,847, entitled "Inverse of min*: min*- (the inverse of max*: max*-)," filed Aug. 15, 2002.
    b. U.S. Provisional Application Ser. No. 60/427,979, "Single stage implementation of min*, max*, min and/or max to perform state metric calculation in SISO decoder," filed Nov. 20, 2002.

BACKGROUND OF THE INVENTION

1. Technical Field of the Invention

The invention relates generally to communication systems; and, more particularly, it relates to encoding of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

FIG. 6 is a diagram illustrating an embodiment of a prior art MLC (Multi-Level Code) encoder 600. Such a coded modulation scheme using MLC was introduced by Imai and Hirakawa as described in the following reference.

H. Imai and S. Hirakawa, "A new multilevel coding method using error correcting codes," *IEEE Trans. Inform. Theory*, Vol. IT-23, pp. 371–377, May 1977.

Information bits are provided to a data partitioner 610 and subsequently provided to a plurality of encoders, shown as encoder 1 621, encoder 2 622, and encoder 3 623. Corresponding encoded bits are output from each of the encoders, and they are provided to a symbol mapper 630. A sequence of discrete valued modulation symbols is output from the symbol mapper 630. In this prior art embodiment, each of the symbols within the sequence of discrete valued modulation symbols is mapped according to the same constellation shape and mapping of the constellation points included therein.

The main goal of using MLC is to optimize the code in Euclidean space rather than dealing with Hamming distance in similar fashion as is performed within TCM (Trellis Coded Modulation). A good description of TCM is provided by Ungerboeck in the following reference.

G. Ungerboeck, "Channel coding with multilevel/phase signals," *IEEE Trans. Inform. Theory*, Vol. IT-28, pp. 55–67, Jan. 1982. In an MLC scheme, typically either Gray code map or Ungerboeck mapping (or labeling) is used.

FIG. 7 is a diagram illustrating an embodiment of prior art MSD (Multi-Stage Decoding) of a level 3 code 700. In order to decode MLC (as also described by Imai and Hirakawa—see reference cited above), a MSD (Multi-Stage Decoding) approach as depicted in FIG. 7 may be employed.

A received I, Q value r 701 is provided simultaneously to a decoder 1 711, a delay element 723, and a delay element 725. The output from the decoder 1 711 is provided to a decoder 2 712, and the output from the decoder 2 712 is provided to a decoder 3 713. The decoding (i.e. prior art MSD of the level 3 code 700) has three parallel paths. Specifically, the output from the decoder 1 711 is also provided to a delay element 721. The output from the delay element 723 is also provided to the decoder 2 712. The output from the delay element 725 is also provided to the delay element 726. The output from the delay element 721 is also provided to the delay element 722. The output from the decoder 2 712 is also provided to a delay element 724. The output from the delay element 726 is also provided to the decoder 3 713.

The MSD approach of this embodiment is in fact a straightforward consequence of the chain rule of Shannon mutual information when the decoder is not implemented in an iterative manner. However, this MSD approach can inherently cause significant time delay as indicated in FIG. 7.

FIG. 8 is a diagram illustrating an embodiment of prior art iterative PID (Parallel Independent Decoding) 800. In this embodiment, a received I, Q value r 801 is simultaneously provided to three separate and parallel operating decoders, shown as a decoder 1 811, a decoder 2 812, and a decoder 3 813. Each of these parallel operating decoders decodes the received provides best estimate of the information bits encoded therein.

As described in the following reference, Wachsmann provides for a suboptimal decoding method that is described as PDL (Parallel independent Decoding of the individual Levels) (this decoding approach is depicted in FIG. 8).

U. Wachsmann, R. F. H. Fischer and J. B. Huber, "Multilevel codes: theoretical concepts and practical design rules," *IEEE Trans. Inform. Theory*, Vol. 45, pp. 1361–1391, July 1999.

The name PDL is simplified to PID (Parallel Independent Decoding) by Hou, et al., as described in the following reference.

J. Hou, P. H. Siegel, L. B. Milsten and H. D. Pfister, "Capacity-approaching bandwidth efficient coded modulation schemes based on low-density parity-check codes," *IEEE Trans. Inform. Theory*, Vol. 49, pp. 2141–2155, September 2003.

Wachsmann (see reference above) shows that the gap between MSD and PID is small if Gray code mapping is used. Wachsmann (see reference above) used turbo code in every level to obtain a better performance of the MLC.

FIG. 9 is a diagram illustrating an embodiment of prior art iterative MSD of a level 3 code 900. This embodiment is somewhat similar to the prior art MSD of the level 3 code 700 of a level 3 code depicted in the FIG. 7.

A received I, Q value r 901 is provided simultaneously to a decoder 1 911, a delay element 923, and a delay element 925. The output from the decoder 1 911 is provided to a decoder 2 912, and the output from the decoder 2 912 is provided to a decoder 3 913. The decoding (i.e. iterative MSD 900) has three parallel paths as well as iterative decoding feedback signals. Specifically, the output from the decoder 1 911 is also provided to a delay element 921. The output from the delay element 923 is also provided to the decoder 2 912. The output from the delay element 925 is also provided to the delay element 926. The output from the delay element 921 is also provided to the delay element 922. The output from the decoder 2 912 is also provided to a delay element 924. The output from the delay element 926 is also provided to the decoder 3 913.

However, this prior art iterative MSD of the level 3 code 900 differs from the MSD of the level 3 code 700, in that, iterative decoding feedback signals are provided to selected functional blocks. For examples, the output of the decoder 1 911 that is provided to the decoder 2 912 is also provided to the decoder 3 913. In addition, the output from the decoder 2 912 that is provided to the decoder 3 913 is also fed back to the decoder 1 911. Similarly, the output from the decoder 3 913 is fed back as input to each of the decoder 1 912 and the decoder 2 912. The iterative decoding approach of this embodiment allows the MSD of the level 3 code 900 to have performance improvement over the MSD of the level 3 code 700.

FIG. 10 is a diagram illustrating an embodiment of prior art iterative PID of a level 3 code 1000. For an MLC with turbo component codes (i.e., each of the individual encoders are turbo encoder), an iterative MSD (IMSD) (as also described by Worz and Hagenauer, see cited references below), or Iterative Parallel Independent Decoding (IPID) is used.

T. Worz and J. Hagenauer, "Iterative decoding for multi-level codes using reliability information," in *Proc. IEEE Global Telecoms. Conf.* (*GLOBECOM*) (Orlando, Fla., December 1992).

P. A. Martin and D. P. Taylor, "On multilevel codes and iterative multistage decoding," *IEEE Trans. Inform. Theory*, Vol. 47, pp. 1916–1925, November 2001.

In this diagram, a received I, Q value r 1001 is provided simultaneously to 3 different decoders shown as a decoder 1 1011, a decoder 2 1012, and a decoder 3 1013. Each of the individual decoders in this embodiment provides feedback signals to assist in the corresponding iterative decoding performed therein. As can be seen, each of the decoders in this IPID embodiment does in fact operate independently on the received I, Q value r 1001.

In the Hou reference (see cited reference above), modulation with ML LDPC (Multi-Level Low Density Parity Check) code is studied, where the performance difference between IMSD and iterative IPID is discussed. It is also shown in that same paper that the gap between the performance of the IMSD and IPID is about 0.07 dB when Gray code mapping is used.

FIG. 11 is a diagram illustrating an embodiment of prior art BICM (Bit Interleaved Coded Modulation) 1100 that is employed in conjunction with LDPC (Low Density Parity Check) coding and modulation encoding. This is yet another class of coded modulation scheme, namely, BICM as described by Caire in the following reference and also as depicted in FIG. 11.

G. Caire, G. Taricoo, and E. Biglien, "Bit-interleaved coded modulation," *IEEE Trans. Inform. Theory*, Vol. 44, pp. 927–946, May. 1998.

In that scheme, only Gray code map works. However, if the signal mapping method is not restricted MLC, then the performance is better than BICM, as is also described by Wachsmann (see reference above).

This embodiment of BICM 1100 operates by performing direct combining of bit encoding and modulation encoding, with the exception that an π (interleaver) 1120 is interposed between a bit encoder 1110 and a modulation encoder 1130.

A binary sequence (e.g., a bit stream of information bits) is provided to the bit encoder 1110 from which encoded bits are output. The bit encoder 1110 introduces a degree of redundancy (or parity) within the bit sequence (i.e., the information bits) provided thereto. The encoded bits output from the bit encoder 1110 may be systematic or non-systematic in nature.

These encoded bits are then provided to the π (interleaver) 1120 to generate a degree of randomness within the coded bits thereby (hopefully) making that coded bit sequence to be more robust to interference, noise, and other deleterious effects. This coded bit sequence that has been interleaved is then provided to a S/P (Serial to Parallel) path (i.e., shown as a bit to m-bit symbol transformation 1121) such that the output symbols may be provided to the modulation encoder 1130. Again, this S/P path performs the bit to m-bit symbol transformation. The modulation encoder 1130 outputs a signal sequence that includes symbols (composed of the interleaved coded bits) that correspond to a modulation having a constellation and a corresponding mapping.

In the art of encoding of signals to be employed within communication systems, there is an ever continual need to provide means by which improved performance may be achieved in trying to reach the ultimate goal of Shannon's limit within a communication channel while operating at a particular SNR. As such, there is a need in the art to provide better means by which encoded signal may be generated for use in communicating information across a communication channel.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Initially, some examples of types of communication systems are presented in which various aspects of the invention may be found. Subsequently, a brief presentation to LDPC (Low Density Parity Check) code is provided. Thereafter, various alternatives of LDPC decoding are presented that may be performed in accordance with certain aspects of the invention. In addition, the "DESCRIPTION OF RELATED ART" section provided above may be used to provide some description of prior art types of MLC signals as well as some prior art means by which those prior art types of signals may be generated and decoded. After that, starting in FIG. 12, greater detail is provided by which MLC LDPC (Multi-Level Code Low Density Parity Check) coded modulation signals mapped using a plurality of mappings may be performed. This includes various LDPC code type architectures as well as generating the mapping of some possible constellation shapes to achieve the improved performance over prior art encoding schemes of MLC signals that employ only a singular mapping.

Figure 1:
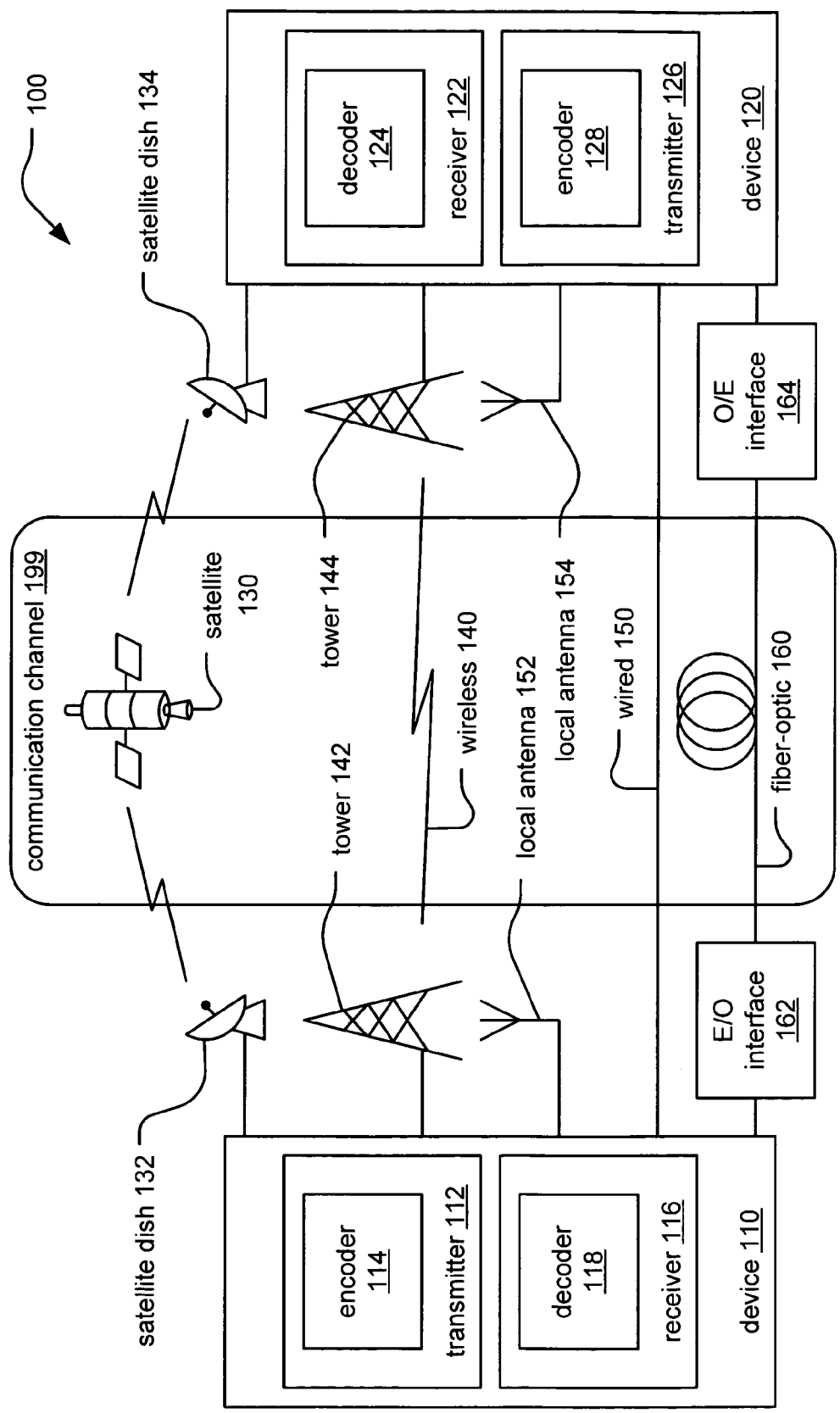
FIG. 1 and FIG. 2 are diagrams illustrating various embodiments of communication systems that may be built in accordance with certain aspects of the invention.
Figure 2:
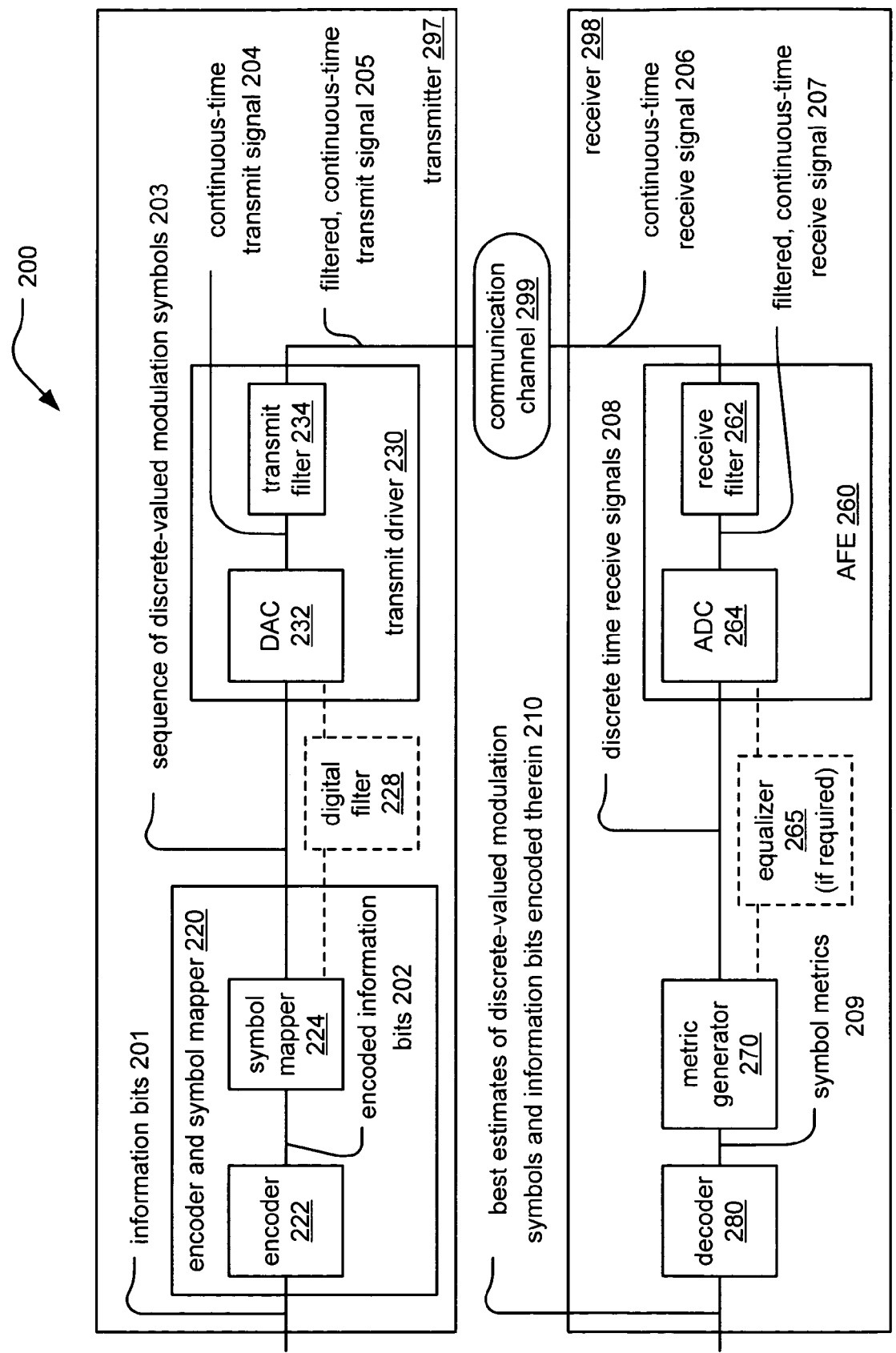

FIG. 1 and FIG. 2 are diagrams illustrating various embodiments of communication systems, 100 and 200, respectively, that may be built in accordance with certain aspects of the invention.

Referring to FIG. 1, this embodiment of a communication system 100 is a communication channel 199 that communicatively couples a communication device 110 situated at one end of the communication channel 199 to another communication device 120 at the other end of the communication channel 199. There are several different types of media by which the communication channel 199 may be implemented. In addition, more than one type of media may be implemented and interfaced together thereby forming the communication channel 199.

As one example, the communication channel 199 may be implemented as a satellite communication channel in which signals are transmitted between the communication device 110 and the communication device 120 via one or more communication links to one or more satellites (a satellite 130 is shown). In such an embodiment, a transmitter 112 within the communication device 110 would be communicatively coupled to a satellite dish 132 that is operable to communicate with a satellite 130. The transmitter 112 may also be communicatively coupled to a wired network. This wired network may include any number of networks including the Internet, proprietary networks, other wired networks, and/or WANs (Wide Area Networks). The transmitter 112 employs the satellite dish 132 to communicate to the satellite 130 via a wireless communication channel. The satellite 130 is able to communicate with a receiver 122 within the communication device 120 (via a corresponding satellite dish 134 communicatively coupled to the communication device 120).

Here, the communication to and from the satellite 130 may cooperatively be viewed as being a wireless communication channel; or each of the communication links to and from the satellite 130 may be viewed as being two distinct wireless communication channels.

For example, the wireless communication "channel" may be viewed as not including multiple wireless hops in one embodiment. In other multi-hop embodiments, the satellite 130 receives a signal from the transmitter 112 (via the satellite dish 132), amplifies it, and relays it to the receiver 122 (via the satellite dish 134); the receiver 122 may also be implemented using terrestrial receivers such as satellite receivers, satellite based telephones, and/or satellite based Internet receivers, among other receiver types. In the case where the satellite 130 receives a signal from the transmitter 112 (via the satellite dish 132), amplifies it, and relays it, the satellite 130 may be viewed as being a "transponder;" this is a multi-hop embodiment. In addition, other satellites may exist that perform both receiver and transmitter operations in cooperation with the satellite 130. In this case, each leg of an up-down transmission via the wireless communication channel would be considered separately. In whichever embodiment, the satellite 130 is operable to establish a communication channel between the transmitter 112 and the receiver 122.

There are a wide variety of satellite communication systems that may be implemented including satellite television broadcast communication systems, HDTV (High Definition Television) broadcast communication systems, as well as satellite data communication systems (e.g., satellite Internet servicing).

In addition, the communication channel 199 may be implemented generally as any type of wireless communication channel 140. There are a variety of types of communication systems in which the wireless communication channel 140 may be implemented, including: cellular communication systems, microwave communication systems, point-to-point radio communication systems, WLAN (Wireless Local Area Network) communication systems, among other wireless communication system types. Generally speaking, the appropriate interface is implemented within the communication device 110 or the communication device 120 to facilitate operation within the particular type of wireless communication channel 140 of a particular embodiment. The communication device 110 may include a tower 142 and the communication device 120 may include a tower 144 to support communication within a microwave communication system.

The communication device 110 may include a local antenna 152, and the communication device 120 may include a local antenna 154; in both cases this will support communication within a point-to-point radio communication system. It is also noted that either of the local antenna 152 or the local antenna 154 may be implemented as a spatially diverse antenna arrangement that includes multiple antennae as well. Such radio front-ends are sometimes referred to as Multiple-Input/Multiple-Output (MIMO) communication devices.

In a cellular communication system, the communication device 110 may be implemented as a base station and employ a tower 142. This base station embodiment of the communication device 110 may be operable to communicate with the communication device 120 when it is implemented as a mobile station (or mobile unit) using a local antenna

154. There are a very wide variety of types of wireless communication systems in which the communication device 110 and the communication device 120 may be implemented. These types of wireless communication systems are shown generally as being supported by the wireless communication channel 140 between the communication device 110 and the communication device 120.

In addition, the communication channel 199 may be implemented generally as any type of wired communication channel 150. Such a wired communication channel 150 may be as focused and well-defined as being a trace connecting two or more integrated circuits on a printed circuit board. Alternatively, such a wired communication channel 150 may be as broad as including each wiring, cabling, interface and every wired segment between communication devices located significant distances from one another. In yet another embodiment, a wired communication channel 150 may be viewed as being the backplane interface between various boards within a larger device such as a server. There are a variety of types of wired communication systems in which the communication device 110 and the communication device 120 may be implemented including communication systems that are serviced by cable media providers (including cable television systems and cable modem/Internet servicing). The wired communication system may alternatively be a DSL (Digital Subscriber Line) communication system, an Ethernet communication system, or a data center communication system, among other types of communication systems employing a wired communication channel 150.

In yet another embodiment, the communication channel 199 may be implemented as a fiber-optic communication channel 160. In such an embodiment, the communication device 110 would interface with the fiber-optic communication channel 160 via an electrical to optical (E/O) interface 162, and the communication device 120 would interface with the fiber-optic communication channel 160 via an optical to electrical (O/E) interface 164.

It is also noted that the communication channel 199 that communicatively couples the communication device 110 and the communication device 120 may also be implemented as a combination of any number of types of communication channels. For example, a first portion of the communication channel 199 may be implemented as a wired communication channel, and a second portion of the communication channel 199 may be implemented as a wireless communication channel. Another portion of the communication channel 199 may be alternatively implemented as a fiber-optic communication channel. There are a myriad of possible combinations of types of communication channels that may be implemented to interconnect the communication device 110 and the communication device 120.

In whichever type of communication system 100 the communication device 110 and the communication device 120 are implemented, and using whichever type of communication channel 199 desired within a particular embodiment, the transmitter of the communication device 110 is operable to encode information, (using an encoder 114) in a manner in accordance with the functionality and/or processing of at least some of the various aspects of the invention to assist in generating a signal that is to be launched into the communication channel 199 via the appropriate interface. The receiver 122 of the communication device 120 is operable to decode a signal (using a decoder 124) received from the communication channel in a manner in accordance with the functionality and/or processing of at least some of the various aspects of the invention.

Generally speaking, at a transmitting end of the communication channel 199, information bits are encoded and appropriately modulated into a format that comports with the type of communication channel across which the signal is to be transmitted. This may also include performing any appropriate filtering and/or frequency-conversion (e.g., usually up-converting) that is necessary to get the signal into a format that comports with the particular type of communication channel across which the signal is to be transmitted.

At a receiving end of the communication channel 199, the received signal is appropriately processed and demodulated from the format that comports with the communication channel 199 so that appropriate decoding may be performed to make best estimates of the information bits that have been encoded at the transmitting end of the communication channel. At the receiving end, this may also include performing any appropriate filtering and/or frequency-conversion (e.g., usually down-converting) that is necessary to get the signal from the format that comports with the particular type of communication channel into a format that can be processed at the receiving end of the communication channel 199.

It is also noted that communication between the communication device 110 and the communication device 120, in each of these various embodiments of communication systems, may support uni-directional or bi-directional communication functionality. In a bi-directional communication system, each of the communication device 110 and the communication device 120 may include a corresponding transmitter (112 and 126, respectively) including an encoder (114 and 128, respectively). Moreover, each of the communication device 10 and the communication device 120 may include a corresponding receiver (116 and 122, respectively) including a decoder (118 and 124, respectively).

However, alternative embodiments envision a communication system 100 including devices that support only uni-directional communication as well without departing from the scope and spirit of the invention. In a uni-directional communication system, the communication device 110 may be implemented as only including the transmitter 112 (as well as the encoder 114) at one end of the communication channel 199, and the communication device 120 may be implemented as only including the receiver 122 (as well as the decoder 124) at one end of the communication channel 199.

Referring to the communication system 200 of FIG. 2, at a transmitting end of a communication channel 299, information bits 201 are provided to a transmitter 297 that is operable perform appropriate encoding before launching an appropriately filtered, continuous-time transmit signal 205 into the communication channel 299. After the filtered, continuous-time transmit signal 205 has been launched into the communication channel 299 from the transmitter 297, the filtered, continuous-time transmit signal 205 is communicated from the transmitter 297 to a receiver 298 at the other end of the communication channel 299. The communication channel 299 may operate to introduce some deleterious effects to the filtered, continuous-time transmit signal 205 including a certain degree of noise having a particular PSD (Power Spectral Density), ISI (Inter-Symbol Interference), undesirable channel filtering effects, frequency spreading effects, and/or attenuation effects, among other types of undesirable effects that may be caused by the communication channel 299.

Within the transmitter 297, encoding of these information bits 201 is performed using an encoder and symbol mapper 220. The encoder and symbol mapper 220 may be viewed in more detail as including an encoder 222 and a symbol mapper 224.

This encoder and symbol mapper 220 may be implemented to support uncoded modulation, LDPC (Low Density Parity Check) encoding and modulation, TCM (Trellis Coded Modulation), turbo coding and modulation, TTCM (Turbo Trellis Coded Modulation), or LDPC (Low Density Parity Check) encoding and modulation, among other types of encoding and modulation, as well as any other types of encodings and modulations that operate to counter the effects of lowered SNR (Signal to Noise Ratio) and potentially introduced ISI (Inter-Symbol Interference) that may occur with a filtered, continuous-time transmit signal 205 as it is transmitted across a communication channel 299.

After the information bits 201 have been appropriately encoded using whichever encoding means is employed within a particular embodiment, the encoded information bits 202 may be grouped to form symbols (and/or codewords) that may be symbol mapped according to any number of different types of modulations (where each modulation includes a constellation shape and unique corresponding mapping of the constellation points included therein).

After the information bits 201 have been appropriately encoded (using the encoder 222) and symbol mapped (using the symbol mapper 224), a sequence of discrete-valued modulation symbols 203 is output from within the encoder and symbol mapper 220. This sequence of discrete-valued modulation symbols 203 is sometimes viewed as being a digital baseband signal. Sometimes, this digital baseband signal is separated into each of the I, Q (In-phase, Quadrature) components for each symbol within the sequence of discrete-valued modulation symbols 203.

Within the transmitter 297 shown in this embodiment, the sequence of discrete-valued modulation symbols 203 may also be viewed as being discrete-time transmit signals. This sequence of discrete-valued modulation symbols 203 (or the discrete-time transmit signals) are then provided to a transmit driver 230 that is operable to comport the sequence of discrete-valued modulation symbols 203 into an appropriate signal that may be launched into the communication channel 299.

The transmit driver 230 includes a DAC (Digital to Analog Converter) 232 that operates by inserting the sequence of discrete-valued modulation symbols 203 (or the discrete-time transmit signals) at a selected modulation rate thereby generating a continuous-time transmit signal 204. The resulting continuous-time transmit signal 204 is then provided to a transmit filter 234 that performs spectral shaping of the continuous-time transmit signal 204 to ensure that the filtered, continuous-time transmit signal 205 substantially resides within the particular frequency band that is appropriate for communication across the communication channel 299.

The transmit driver 230 may also perform any appropriate frequency-conversion (e.g., usually up-converting) that is necessary to get the sequence of discrete-valued modulation symbols 203 (or the discrete-time transmit signals) into a format that comports with the particular type of communication channel 299 across which the filtered, continuous-time transmit signal 205 is to be transmitted. Such frequency conversion is sometimes performed from a baseband frequency to a carrier frequency via an IF (Intermediate Frequency). In alternative embodiments, the frequency conversion may be performed directly from a baseband frequency to a carrier frequency. Ultimately, the resulting, filtered continuous-time transmit signal 205 is then launched into the communication channel 299.

In addition, a digital filter 228 may also be interposed between the encoder and symbol mapper 220 and the transmit driver 230 to allow the operation of the transmit filter 234 (situated after the DAC 232 within the transmit driver 230) to operate more easily and more effectively in shaping the filtered, continuous-time transmit signal 205 to be launched into the communication channel 299.

When the transmitter 297 employs a particular type of encoding and modulation, a corresponding receiver 298 (that receives a signal transmitted from the transmitter 297 via the communication channel 299) is then operable to perform the appropriately corresponding decoding of such an encoded and transmitted signal. In addition, the receiver 298 knows which modulation type (including the constellation shape and mapping of the constellation points therein) has been employed by encoder and symbol mapper 220 of the transmitter 297, so that the receiver 298 may appropriately decode the transmitted sequence of information bearing symbols sent from the transmitter.

In addition, when the transmitter 297 employs uncoded modulation in conjunction with a particular symbol mapping of a constellation, then the receiver 298 is operable to decoding of such a sequence of discrete-valued uncoded modulation symbols with knowledge of the manner in which the information bits have been symbol mapped in the encoder and symbol mapper 220 within the transmitter 297.

Generally speaking, a corresponding receiver 298 is operable to perform appropriate decoding of a continuous-time receive signal 206 with knowledge of the particular manner in which information bits 201 had been encoded and symbol mapped in the encoder and symbol mapper 220 within the transmitter 297.

The filtered, continuous-time transmit signal 205 that has been transmitted across a communication channel 299 (i.e., from the transmitter 297) is received by the receiver 298. At the receiver end of the communication channel 299, this received continuous-time signal may be referred to as a continuous-time receive signal 206. The continuous-time receive signal 206 is provided to an AFE (Analog Front End) 260 that includes a receive filter 262 and an ADC (Analog to Digital Converter) 264. The receive filter 262 that may be implemented to perform spectral shaping of the continuous-time receive signal 206 to ensure suppression of noise and any other undesired signals outside of the transmission band and also to ensure equalization of the continuous-time receive signal 206 within the transmission band. Moreover, this receive filter 262 may operate to perform spectral shaping, in conjunction with a transmit filter 234 at the transmitter end of the communication channel 299 (e.g., in conjunction with the transmit filter 234 within the transmitter 297). This spectral shaping may be performed in the transmitter 297 alone (using the transmit filter 234) or in both the transmitter 297 and the receiver 298 (cooperatively using both the transmit filter 234 and the receive filter 262).

The AFE 260 may also perform any appropriate frequency-conversion (e.g., usually down-converting) that is necessary to get the continuous-time receive signal 206 from the format that comports with the particular type of communication channel 299 to a format that may be processed within the receiver 298. Such frequency conversion is sometimes performed from a carrier frequency to a baseband frequency via an IF (Intermediate Frequency). In alternative embodiments, the frequency conversion may be performed directly from a carrier frequency to a baseband frequency.

This now filtered, continuous-time receive signal 207 (output from the receive filter) is then sampled using an ADC (Analog to Digital Converter) 264 at the modulation rate thereby obtaining discrete-time receive signals 208.

These discrete-time receive signals 208 are then provided to a metric generator 270 where metrics are calculated based on the modulation by which the sequence of discrete values modulation symbols was generated using the symbol mapper 224 within the transmitter 297. For example, the obtained discrete-time receive signals 208 are typically mapped according to the corresponding I, Q (In-phase, Quadrature) values within the constellation having a particular mapping. More specifically, a particular symbol is mapped according to a modulation (i.e., constellation shape and mapping) to which that symbol corresponds. In a perfect communication system 200, an appropriately demodulated, received symbol would map directly onto a constellation point. The metrics calculated by the metric generator 270 typically correspond to the Euclidean distances (sometimes including noise, or noise variance, correction scaling) between the each of the constellation points and the location to which the symbol actually maps.

The metric generator 270 then outputs these symbol metrics 209 to a decoder 280, and the symbol metrics 209 are now employed to perform decoding in a manner that corresponds to the manner in which information bits 201 have been encoded and symbol mapped at the transmitter end of the communication channel 299 (i.e., in the transmitter 297). For example, the decoder 280 may be implemented to perform LDPC decoding or any number of other types of decodings that correspond to the manner in which information bits 201 are encoded at the transmitter end of the communication channel 299.

If required, an equalizer 265 may perform additional equalization (usually implemented as adaptive equalization). Such an equalizer 265 (typically situated after the sampling that is performed by the ADC 264) operates to ensure that the discrete-time receive signals 208 have the characteristics that are required for subsequent estimation of the transmitted sequence of information bearing modulation symbols and the information bits encoded therein. The ultimate outputs of the decoder 280 are best estimates of the discrete-valued modulation symbols and information bits encoded therein 210.

In addition, several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signal. Before more details are provided below, a general description of LDPC codes is provided.

Figure 3:
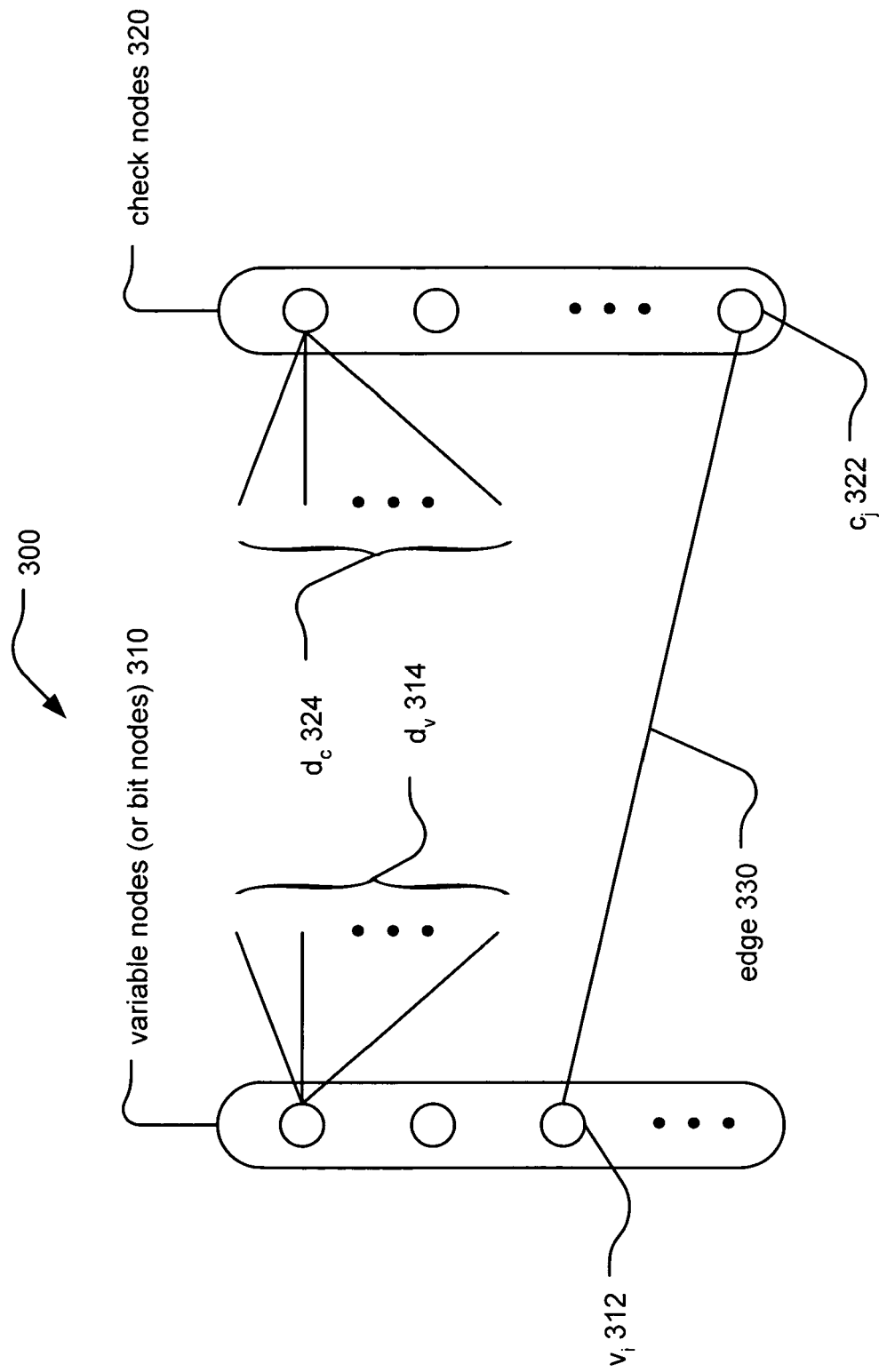
FIG. 3 is a diagram illustrating an embodiment of an LDPC (Low Density Parity Check) code bipartite graph.

FIG. 3 is a diagram illustrating an embodiment of an LDPC (Low Density Parity Check) code bipartite graph 300. In the art, an LDPC bipartite graph may also be referred to as a Tanner graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

LDPC codes were introduced by R. Gallager in [1] referenced below and by M. Luby et al. in [2]0 also referenced below.

[1] R. Gallager, Low-Density Parity-Check Codes, Cambridge, MA: MIT Press, 1963.

[2] M. Luby, M. Mitzenmacher, M. A. Shokrollahi, D. A. Spielman, and V. Stemann, "Practical Loss-Resilient Codes." Proc. 29th Symp. on Theory of Computing, 1997, pp. 150–159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i, j). However, on the other hand, given an edge e=(i, j), the nodes of the edge may alternatively be denoted as by e=(v(e), c(e)) (or e=(b(e), c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$, and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Lugy et al. in [2] referenced above.

In general, with a graph of an LDPC code, the parameters of an LDPC code can be defined by a degree of distribution, as described within M. Lugy et al. in [2] referenced above and also within the following reference:

[3] T. J. Richardson and R. L. Urbanke, "The capacity of low-density parity-check code under message-passing decoding," IEEE Trans. Inform. Theory, Vol. 47, pp. 599–618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects of the invention are also operable to accommodate both regular LDPC codes and irregular LDPC codes.

The LLR (Log-Likelihood Ratio) decoding approach of LDPC codes may be described generally as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code's parity check matrix that is used to check the parity of the received vector. The LLR is the logarithm of the ratio of these two calculated probabilities. This LLR gives a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1}), vH^T=0\}$ being an LDPC code and viewing a received vector, $y=(y_0, \ldots, y_{N-1})$, within the sent signal having the form of $((-1)^{v_{0i}}, \ldots, (-1)^{v_{N-1}})$, then the metrics of the channel may be defined as $p(y_i|v_i=0)$, $p(y_i|v_i=1)$, $i=0, \ldots, N-1$. The LLR of a metric, $L_{metric}(i)$, will then be defined as follows:

$$L_{metric}(i) = \ln \frac{p(y_i \mid v_i = 0)}{p(y_i \mid v_i = 1)}$$

It is noted than "ln," as depicted herein within various mathematical expressions, refers to the natural logarithm having base e.

For every variable node $v_i$, its LLR information value will then be defined as follows:

$$\ln \frac{p(v_i = 0 \mid y_i)}{p(v_i = 1 \mid y_i)} = L_{metric}(i) + \ln \frac{p(v_i = 0)}{p(v_i = 1)}$$

Since the variable node, $v_i$, is in an LDPC codeword, then the value of the ratio of these values, $$\ln \frac{p(v_i = 0)}{p(v_i = 1)},$$

may be replaced by the following $$\ln \frac{p(v_i = 0, vH^T = 0 \mid y)}{p(v_i = 1, vH^T = 0 \mid y)} = \sum_{(i,j) \in E_v(i)} \ln \frac{p(v_i = 0, vh_j^T = 0 \mid y)}{p(v_i = 1, vh_j^T = 0 \mid y)}$$

where $E_v(i)$ is a set of edges starting with $v_i$ as defined above.

When performing the BP (Belief Propagation) decoding approach in this context, then the value of $$\ln \frac{p(v_i = 0, vh_j^T = 0 \mid y)}{p(v_i = 1, vh_j^T = 0 \mid y)}$$

may be replaced by the following relationship $$L_{check}(i, j) = \ln \frac{p\left(\sum_{e \in E_c(j) \setminus \{(i,j)\}} v_{v(e)} = 0 \mid y\right)}{p\left(\sum_{e \in E_c(j) \setminus \{(i,j)\}} v_{v(e)} = 1 \mid y\right)}$$

$L_{check}(i, j)$ is called the EXT (extrinsic) information of the check node $c_j$ with respect to the edge $(i, j)$. In addition, it is noted that $e \in E_c(j) \setminus \{(i, j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual info bit values within a received vector. Also in a BP approach, then the extrinsic information of the variable node $v_i$ with respect to the edge $(i, j)$ may be defined as follows:

$$L_{var}(i, j) = L_{metric}(i) + \sum_{(i,k) \in E_v(i) \setminus \{(i,j)\}} L_{check}(i, k).$$

From certain perspectives, certain aspects of the invention may also be implemented within communication systems that involve combining LDPC coding and modulation to generate LDPC coded modulation signals. These LDPC coded modulation signals may also be of the type that they have a code rate and/or modulation (constellation and mapping) that varies as frequently as on a frame by frame basis and/or as frequently as on a symbol by symbol basis.

Figure 4:
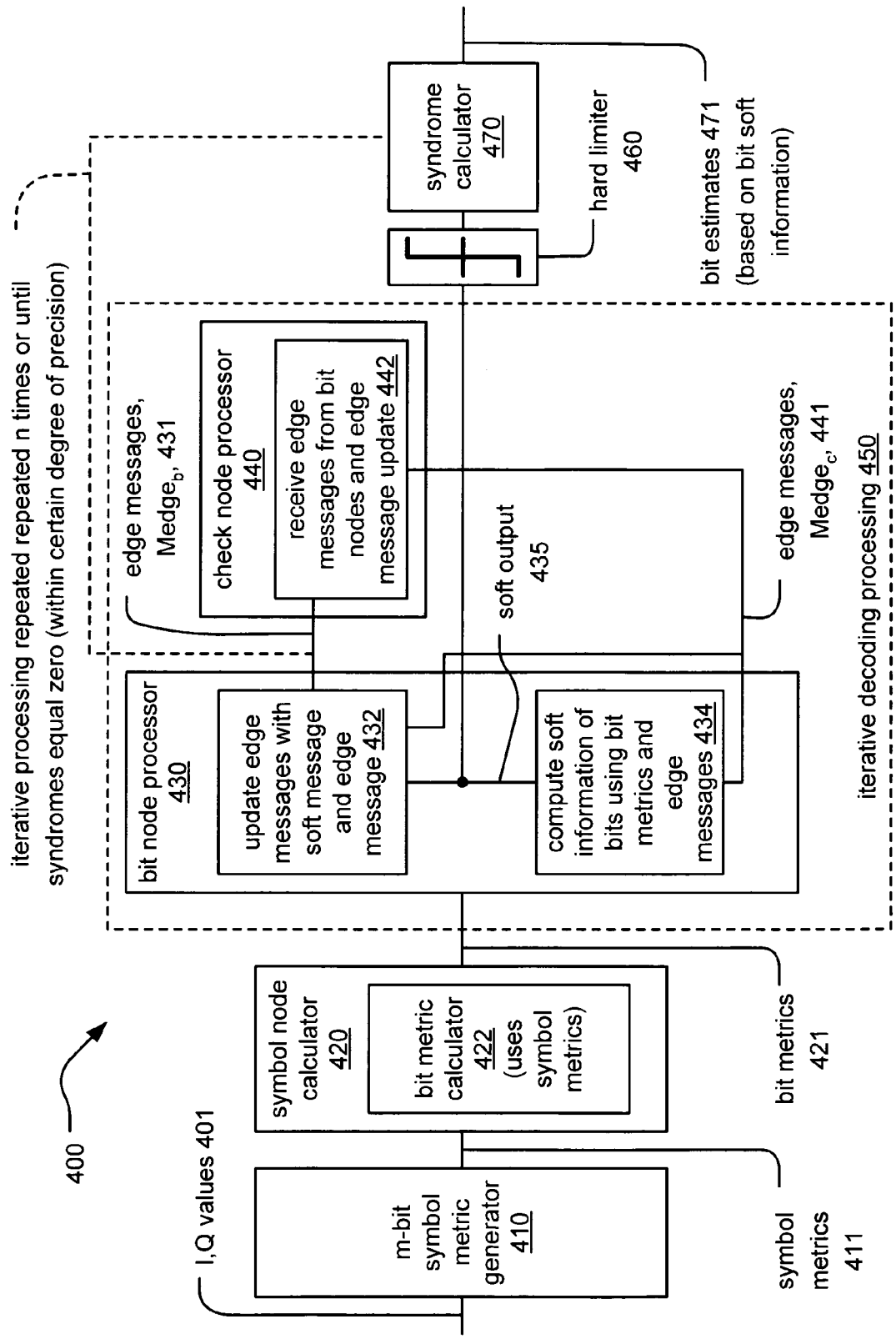
FIG. 4 is a diagram illustrating an embodiment of LDPC (Low Density Parity Check) decoding functionality using bit metric according to certain aspects of the invention.

FIG. 4 is a diagram illustrating an embodiment of LDPC (Low Density Parity Check) decoding functionality using bit metric 400 according to certain aspects of the invention. To perform decoding of an LDPC coded signal having an m-bit signal sequence, the functionality of this diagram may be employed. After receiving the I, Q (In-phase, Quadrature) values 401 of a signal at the symbol nodes, an m-bit symbol metric generator 410 calculates the corresponding symbol metrics 411. At the symbol nodes, these symbol metrics 411 are then passed to a symbol node calculator functional block 420 that uses these received symbol metrics 411 to calculate the bit metrics 421 corresponding to those symbols. These bit metrics 421 are then passed to the bit nodes connected to the symbol nodes according to the LDPC code bipartite graph by which the LDPC coded signal has been generated and by which it is to be decoded.

Thereafter, at the bit nodes, a bit node processor 430 operates to compute the corresponding soft messages of the bits. Then, in accordance with iterative decoding processing 450, the bit node processor 430 receives the edge messages with respect to the check nodes, Medge$_c$ 441, from a check node processor 440 and updates the edge messages with respect to the bit nodes, Medge$_b$ 431, with the bit metrics 421 received from the symbol node calculator functional block 420. These edge messages with respect to the bit nodes, Medge$_b$ 431, after being updated, are then passed to the check node processor 440.

At the check nodes, the check node processor 440 then receives these edge messages with respect to the bit nodes, Medge$_b$ 431, (from the bit node processor 430) and updates the them accordingly thereby generating the next updated version of edge messages with respect to the check nodes, Medge$_c$ 441. These updated edge messages with respect to the check nodes, Medge$_c$ 441, are then passed back to the bit nodes (e.g., to the bit node processor 430) where the soft information of the bits is calculated using the bit metrics 421 and the current iteration values of the edge messages with respect to the bit nodes, Medge$_b$ 431. Thereafter, using this just calculated soft information of the bits (shown as the soft output 435), the bit node processor 430 updates the edge messages with respect to the bit nodes, Medge$_b$ 431, using the previous values of the edge messages with respect to the bit nodes, Medge$_b$ 431 (from the just previous iteration) and the just calculated soft output 435. The iterative decoding processing 450 continues between the bit nodes and the check nodes (i.e., between the bit node processor 450 and the check node processor 440) according to the LDPC code bipartite graph that was employed to encode and generate the signal that is being decoded.

These iterative decoding processing steps, performed by the bit node processor 430 and the check node processor 440, are repeated a predetermined number of iterations (e.g., repeated n times, where n is selectable). Alternatively, these iterative decoding processing steps are repeated until the syndromes of the LDPC code are all equal to zero (within a certain degree of precision).

The soft output 435 is generated within the bit node processor 430 during each of the decoding iterations. In this embodiment, this soft output 435 may be provided to a hard limiter 460 where hard decisions may be made, and that hard decision information may be provided to a syndrome calculator 470 to determine whether the syndromes of the LDPC code are all equal to zero (within a certain degree of precision that may be selected by a designer or adaptively modified in real time in response to one or more operational parameters). That is to say, the syndrome calculator 470 determines whether each syndrome associated with the LDPC code is substantially equal to zero as defined by some degree of precision (either predetermined degree or adaptively determined degree). For example, when a syndrome has a mathematically non-zero value that is less than some threshold as defined by a predetermined degree of precision, then that syndrome is deemed to be substantially equal to zero. Also, when a syndrome has a mathematically non-zero value that is less than some threshold as defined by an adaptively determined degree of precision, then that syndrome is deemed to be substantially equal to zero. When a syndrome has a mathematically non-zero value that is greater than the threshold as defined by a predetermined degree of precision, then that syndrome is deemed to be substantially not equal to zero. Also, when a syndrome has a mathematically non-zero value that is greater than the threshold as defined by an adaptively determined degree of precision, then that syndrome is deemed to be substantially not equal to zero. When the syndromes are not substantially equal to zero, the iterative decoding processing 450 continues again by appropriately updating and passing the edge messages between the bit node processor 430 and the check node processor 440. For example, the edge messages with respect to the bit nodes, Medge$_b$ 431, are passed to the check node processor 440 from the bit node processor 430. Analogously, the edge messages with respect to the check nodes, Medge$_c$ 441, are passed to the bit node processor 430 from the check node processor 440 from.

After all of these steps of the iterative decoding processing 450 have been performed, then the best estimates of the bits (shown as bit estimates 471) are output based on the bit soft information. In the approach of this embodiment, the bit metric values that are calculated by the symbol node calculator functional block 420 are fixed values and used repeatedly in updating the bit node values.

Figure 5:
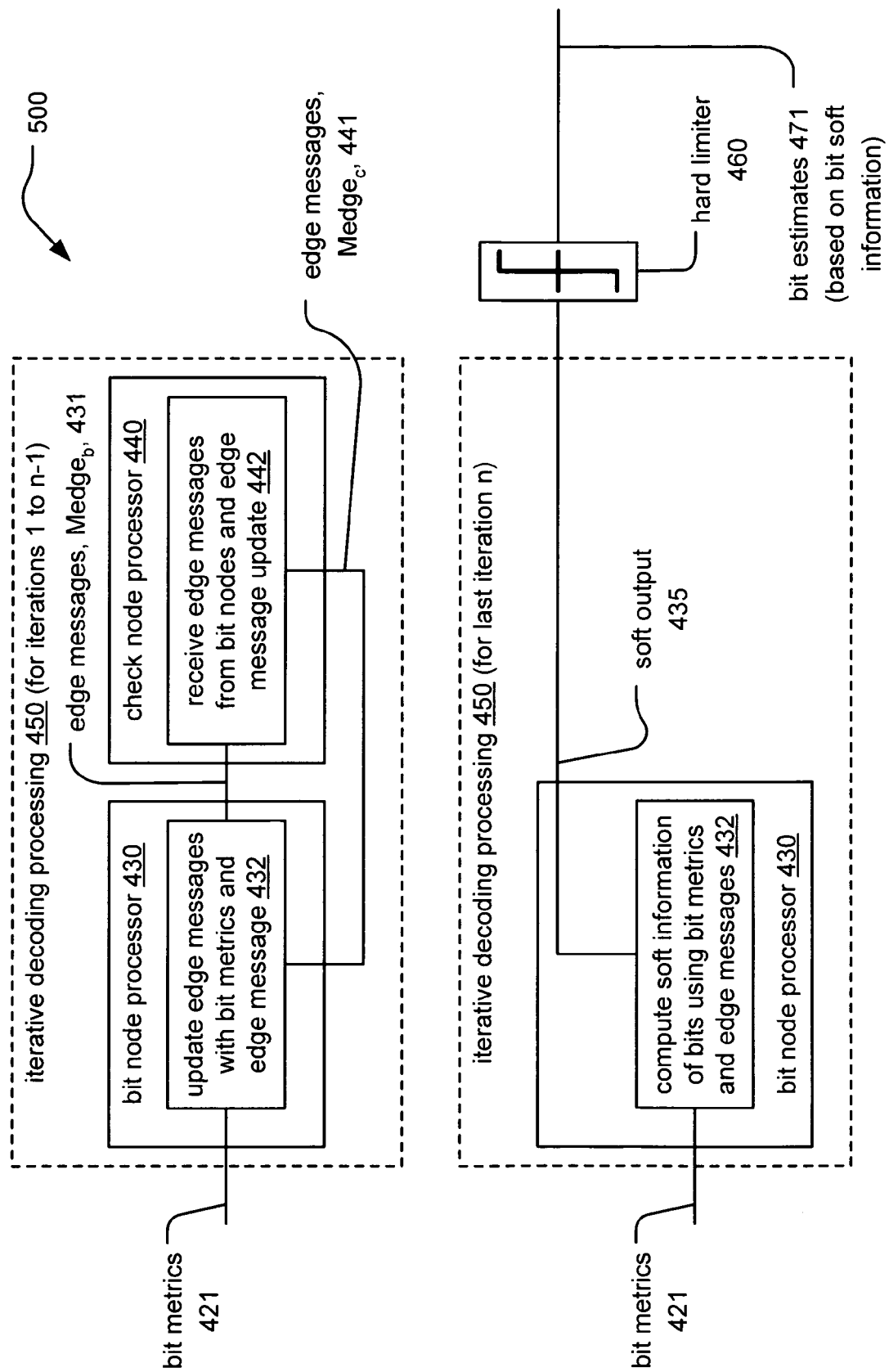
FIG. 5 is a diagram illustrating an alternative embodiment of LDPC decoding functionality using bit metric according to certain aspects of the invention (when performing n number of iterations).
Figure 6:
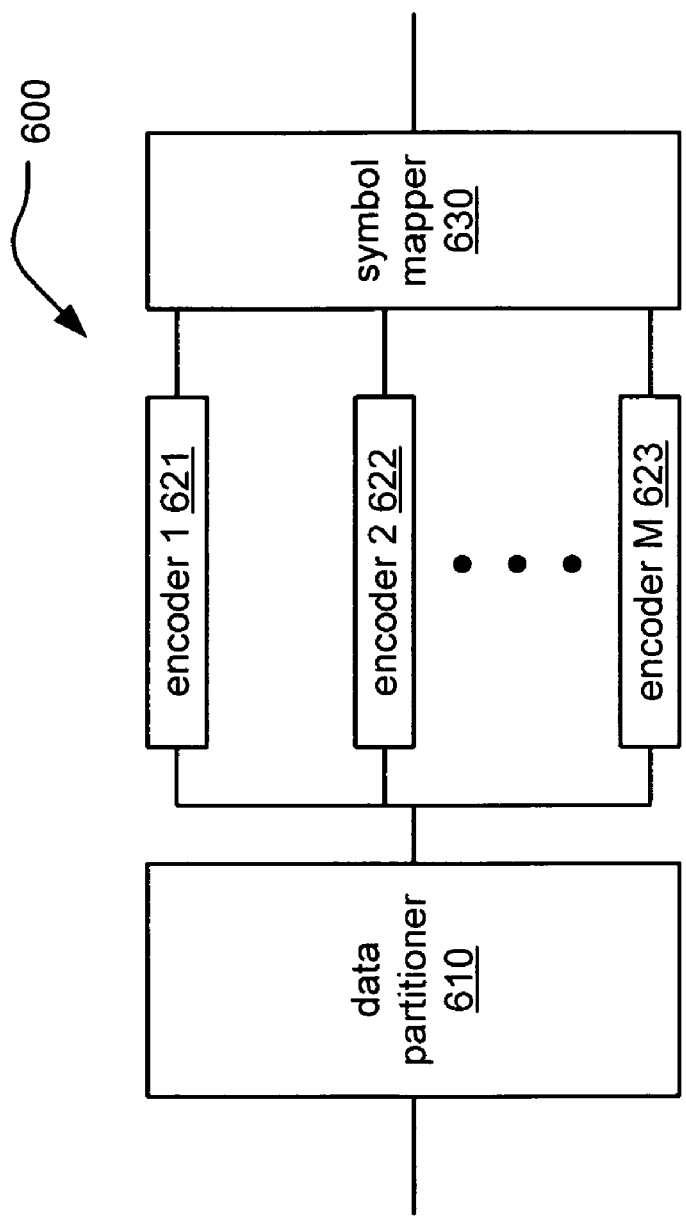
FIG. 6 is a diagram illustrating an embodiment of a prior art MLC (Multi-Level Code) encoder.
Figure 7:
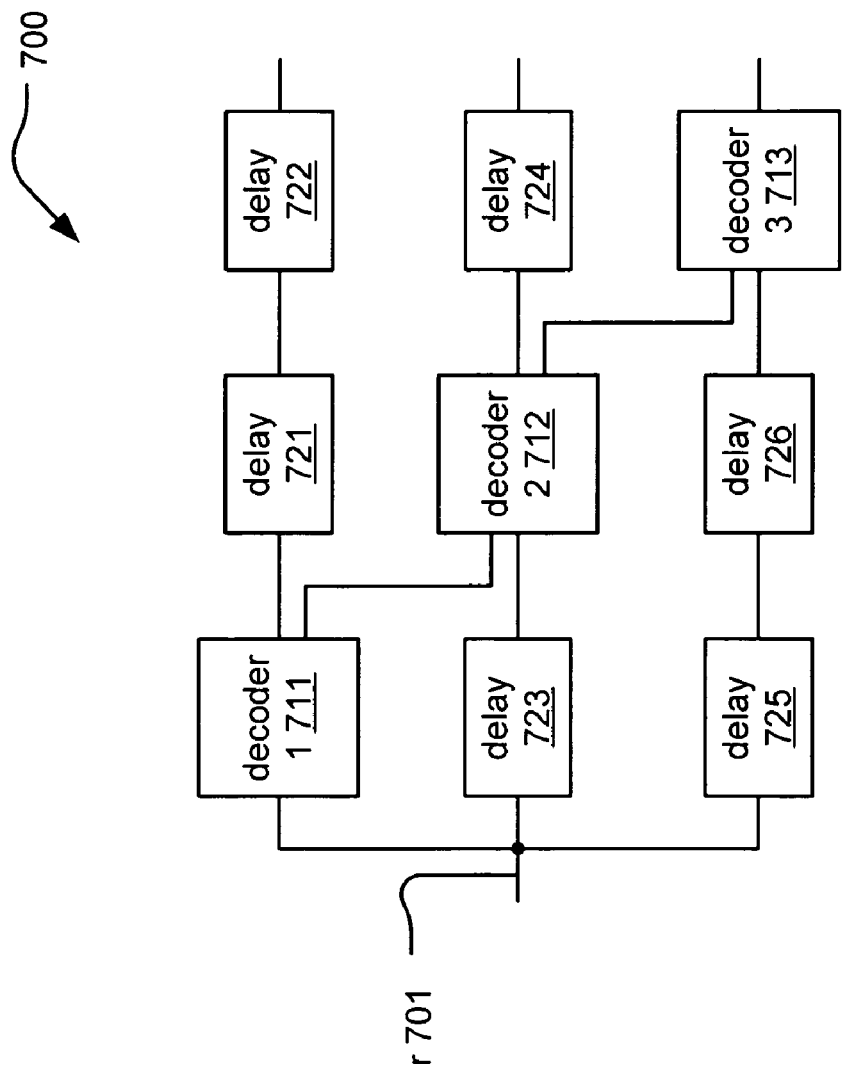
FIG. 7 is a diagram illustrating an embodiment of prior art MSD (Multi-Stage Decoding) of a level 3 code.
Figure 8:
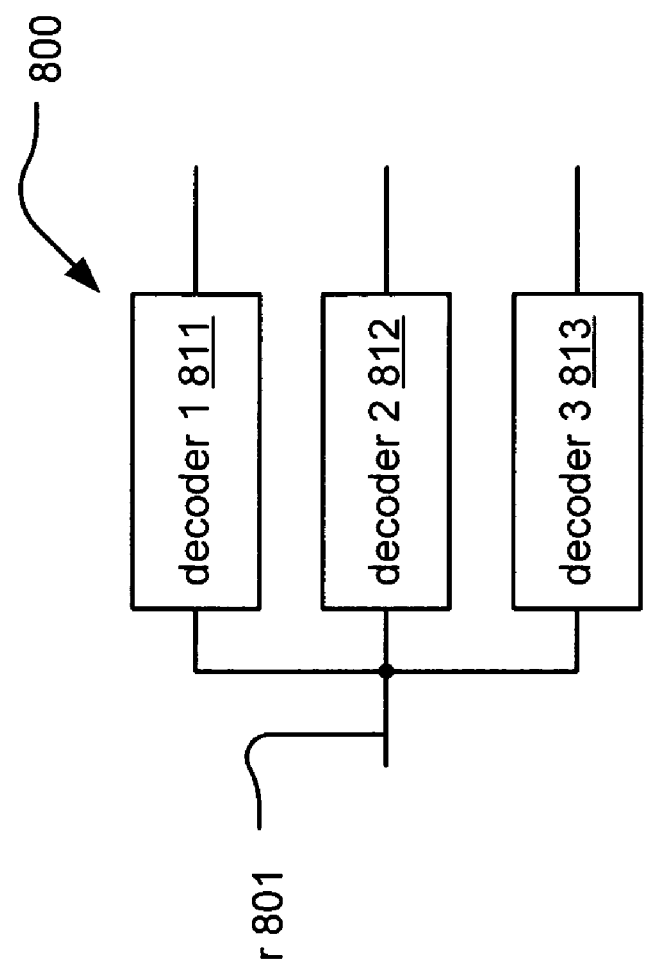
FIG. 8 is a diagram illustrating an embodiment of prior art iterative PID (Parallel Independent Decoding).
Figure 9:
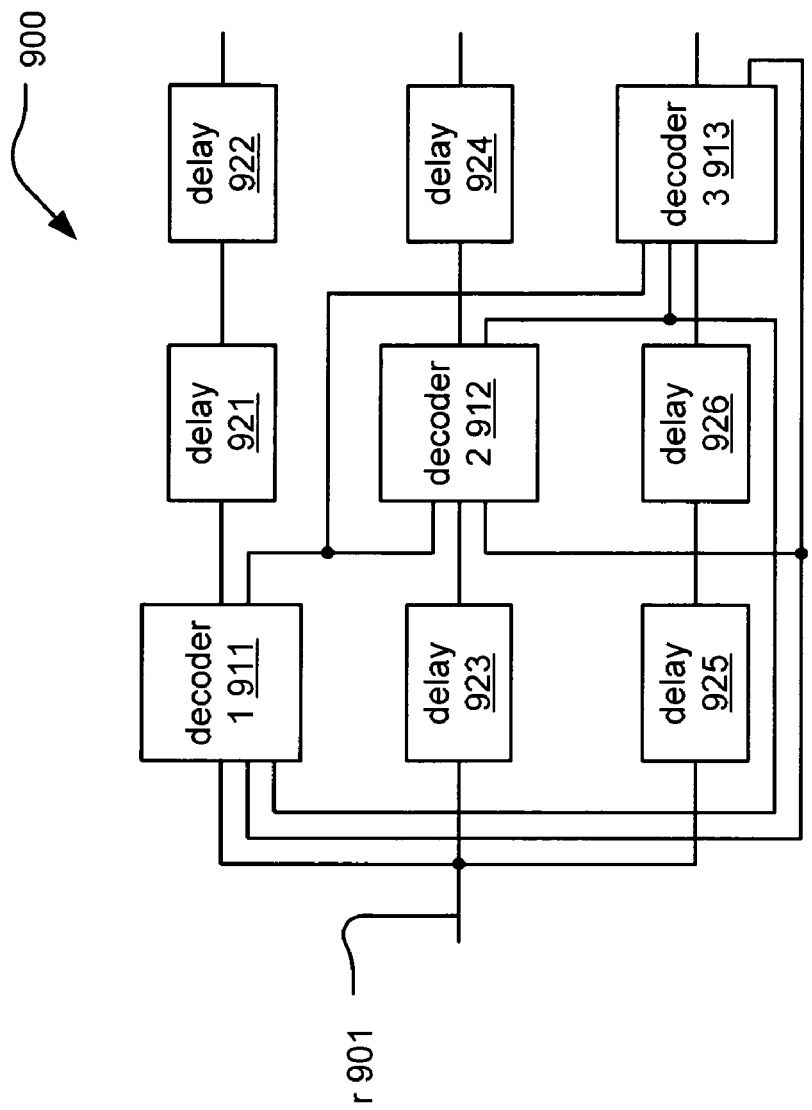
FIG. 9 is a diagram illustrating an embodiment of prior art iterative MSD of a level 3 code.
Figure 10:
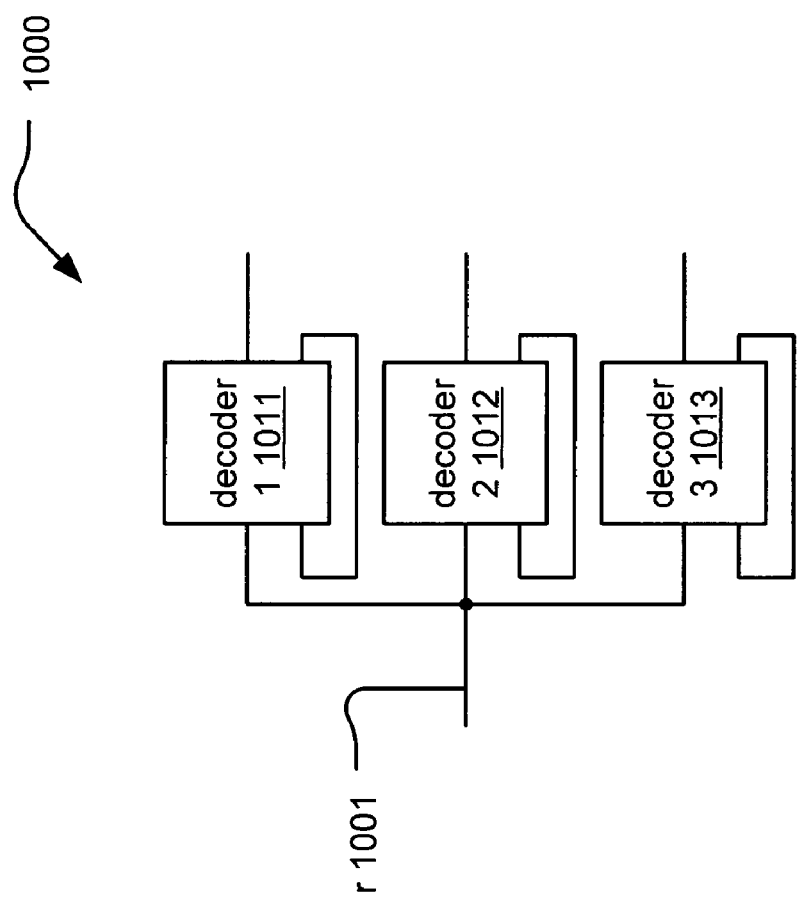
FIG. 10 is a diagram illustrating an embodiment of prior art iterative PID of a level 3 code.
Figure 11:
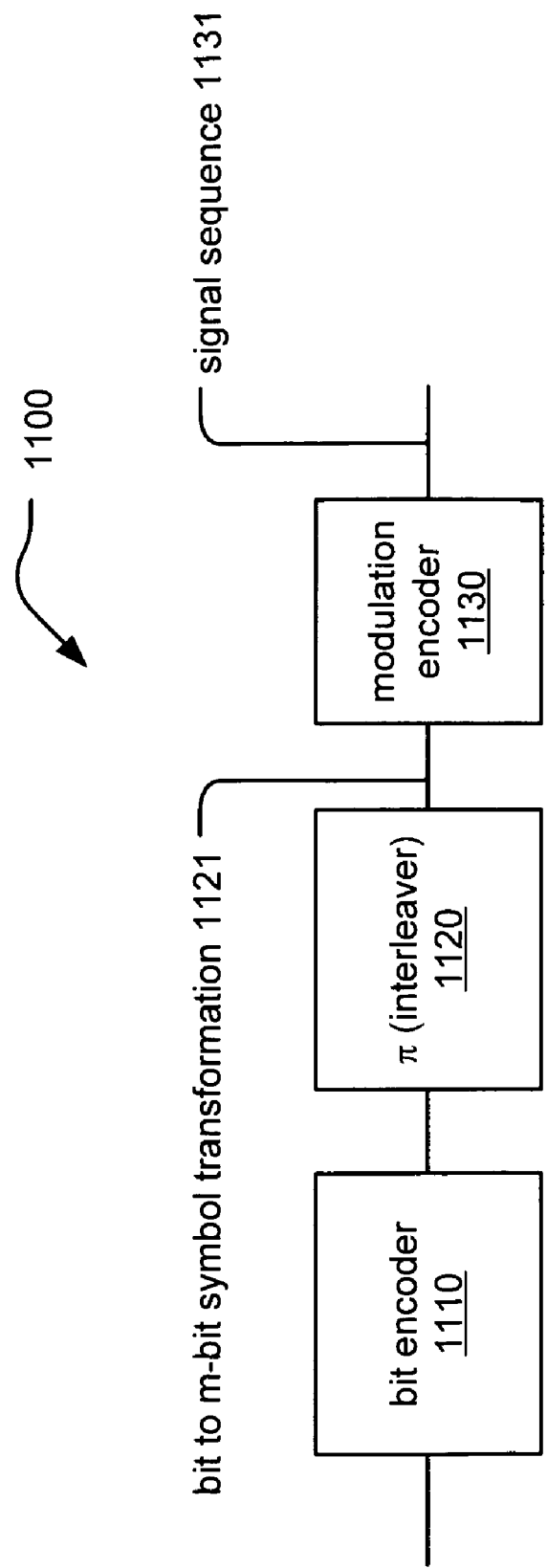
FIG. 11 is a diagram illustrating an embodiment of prior art BICM (Bit Interleaved Coded Modulation) that is employed in conjunction with LDPC (Low Density Parity Check) coding and modulation encoding.

FIG. 5 is a diagram illustrating an alternative embodiment of LDPC decoding functionality using bit metric 500 according to certain aspects of the invention (when performing n number of iterations). This embodiment shows how the iterative decoding processing 450 of the FIG. 4 may be performed when a predetermined number of decoding iterations, shown as n, is performed. If the number of decoding iterations is known beforehand, as in a predetermined number of decoding iterations embodiment, then the bit node processor 430 may perform the updating of its corresponding edge messages with respect to the bit nodes, Medge$_b$ 431, using the bit metrics 421 themselves (and not the soft output 435 as shown in the previous embodiment and described above). This processing may be performed in all but the last decoding iteration (e.g., for iterations 1 through n−1). However, during the last iteration, the bit node processor 430 calculates the soft output 435. The soft output 435 is then provided to the hard limiter 460 where hard decisions may be made of the bits. The syndromes need not be calculated in this embodiment since only a predetermined number of decoding iterations are being performed.

Now that a description of some of the various communication systems in which certain aspects of the invention may be found have been as well as some of the possible embodiments by which decoding of LDPC coded signals may be performed have been presented, the reader is directed back to the "DESCRIPTION OF RELATED ART" section. The "DESCRIPTION OF RELATED ART" section above provides some description of prior art types of MLC signals as well as some prior art means by which those prior art types of signals may be generated and decoded within the FIG. 6, FIG. 7, FIG. 8, FIG. 9, FIG. 10, and FIG. 11.

Certain aspects of the invention may be found in a MLC (Multi-Level Code) with multiple mappings. In previously filed, and pending, patent applications (to which priority is claimed above, for which the disclosures have been incorporated herein by reference, and having common inventorship as the present patent application and also having a common assignee), the concept of bit-interleaved LDPC coded modulation with multiple mappings is introduced based on the degree property of LDPC code.

It is shown that the performance gain is about 0.05 dB when employing bit-interleaved LDPC coded modulation with multiple mappings. Similarly, this idea of multiple mappings can be applied to multilevel LDPC coded modulation or other MLC (Multi-Level Code) signals as well without departing from the scope and spirit of the invention. In general, for any signal constellation, one can select as many as possible maps according to the property of the LDPC codes of all of the levels of the MLC.

Consider an MLC with block length N, i.e., the code in every level has length N. Divide the whole block to parts such that the sub-block length is $N_1, \ldots, N_L$ with $$\sum_{i=1}^{L} N_i = N.$$

Take L different maps, $map_1, map_2, \ldots, map_L$, which may be Gray code maps based on Ungerboeck's set-partition as described in the Ungerboeck reference (see citation above), block partitioning map and mixing partitioning map as described in the Wachsmann reference (see citation above), or the other maps. The modulation scheme, $map_i$, is used for the i-th sub-block as depicted within the FIG. 12.

Figure 12:
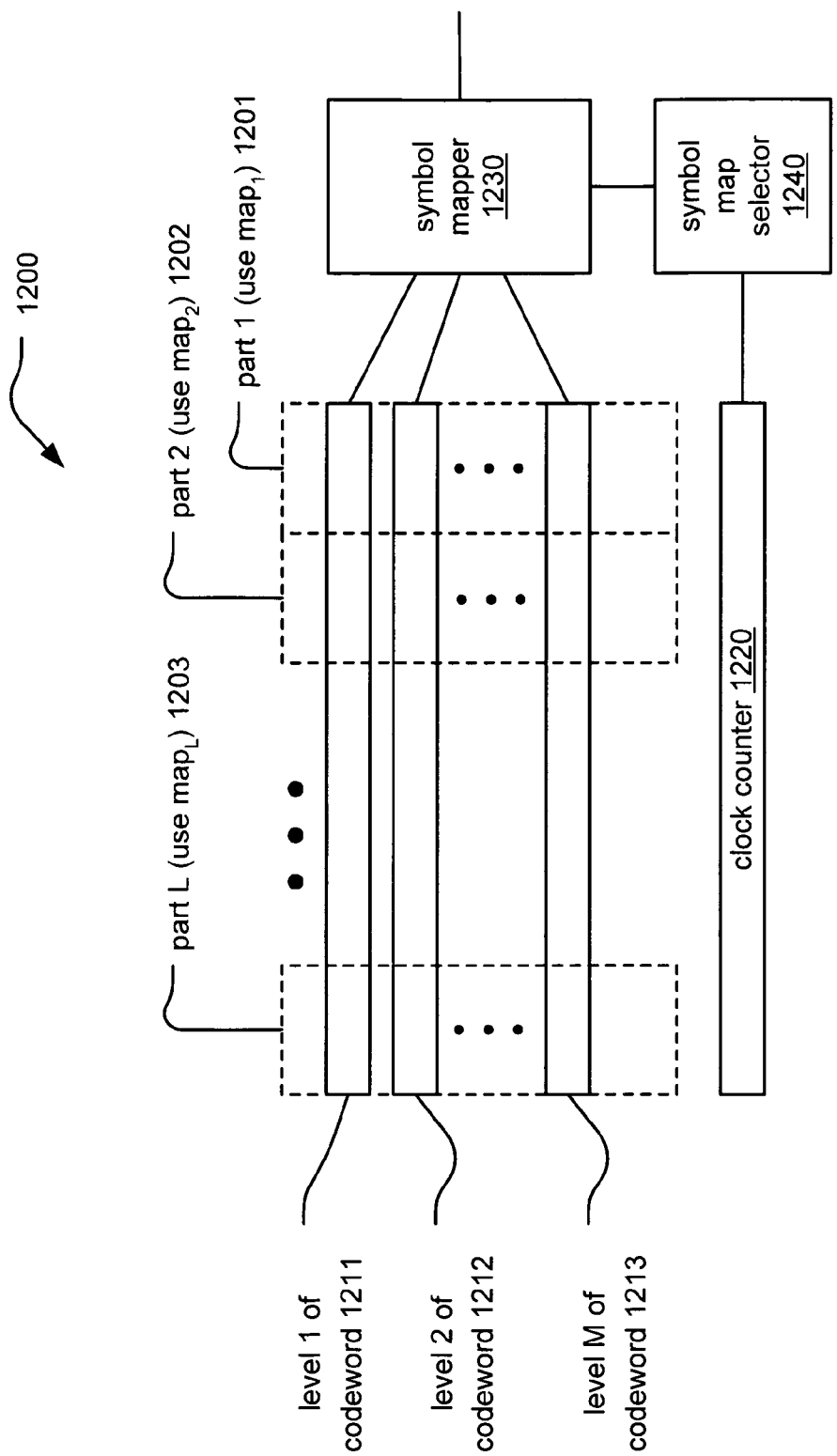
FIG. 12 is a diagram illustrating an embodiment of an MLC employing multiple signal maps in accordance with certain aspects of the invention.

FIG. 12 is a diagram illustrating an embodiment of an MLC employing multiple signal maps 1200 in accordance with certain aspects of the invention. The MLC includes multiple levels of codewords. For example, the MLC includes a level 1 of codeword 1211, a level 2 of codeword 1212, ..., and a level M of codeword 1213. The entire MLC has a block length of N (again, each codeword in the MLC has a length of N). The entire MLC block is then divided into a plurality of sub-blocks. These sub-blocks may be generated by evenly dividing the entire MLC block into a plurality of sub-blocks such that each sub-block has the same length in some embodiments. For example, this may involve dividing the whole MLC block to parts such that the sub-block length is $N_1, \ldots, N_L$ with $$\sum_{i=1}^{L} N_i = N.$$

Thereafter, a plurality of mappings is employed to map bits selected from the various sub-blocks. As an example, consider L different maps: $map_1, map_2, \ldots, map_L$. Looking at this diagram, the bit(s) selected from a part 1 of the MLC use the $map_1$, as indicated by the reference numeral 1201. Similarly, the bit(s) selected from a part 2 of the MLC use the $map_2$, as indicated by the reference numeral 1202. This continues on throughout all of the parts of the MLC block. Finally, the bit(s) selected from a part L of the MLC use the $map_L$, as indicated by the reference numeral 1203.

These selected encoded bits, selected from the various sub-blocks of the MLC block, are provided to a symbol mapper 1230. A clock counter 1220 provides a clock signal to a symbol map selector 1240 to direct the operation of the symbol mapper 1230. In this configuration, the symbol mapper 1230 is operable to map the various symbols provided thereto to any one of a plurality of mappings thereby generating and outputting a MLC LDPC (Multi-Level Code Low Density Parity Check) coded modulation signal that is mapped using a plurality of mappings.

Figure 13:
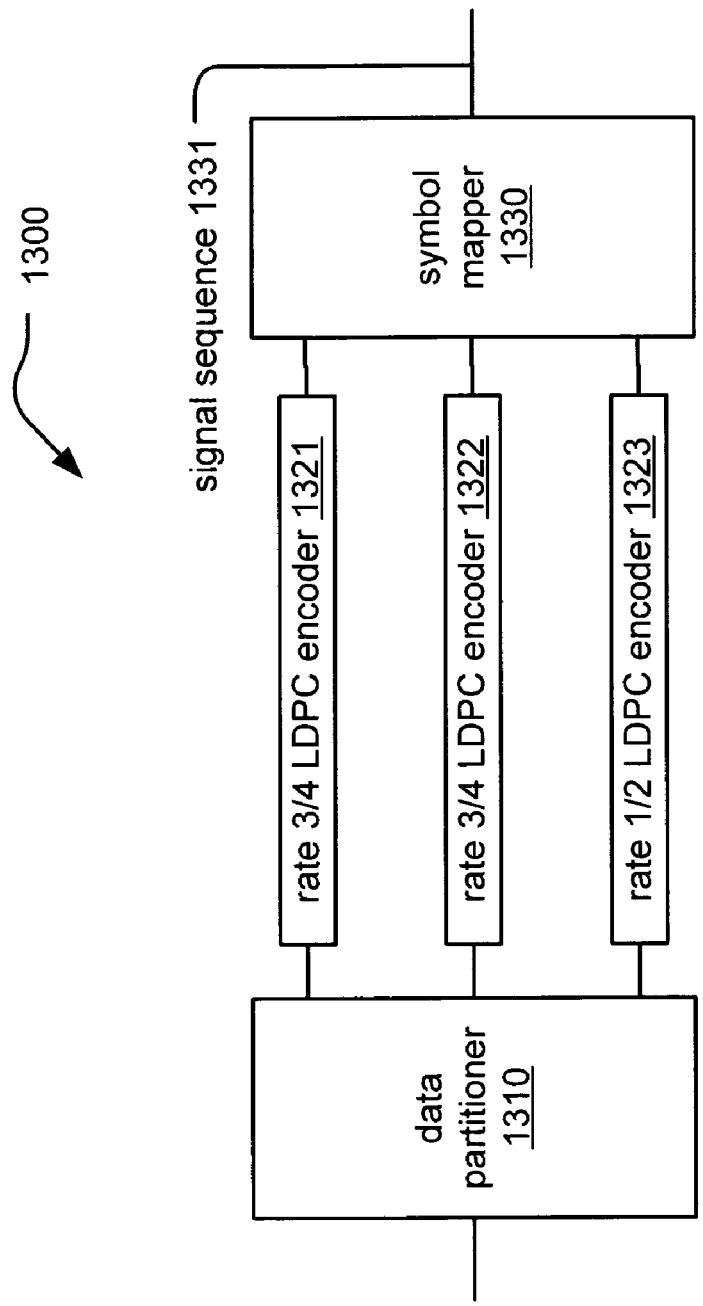
FIG. 13 is a diagram illustrating an embodiment of a 3 level LDPC (Low Density Parity Check) encoder that is built in accordance with the invention.

FIG. 13 is a diagram illustrating an embodiment of a 3 level LDPC (Low Density Parity Check) encoder 1300 that is built in accordance with certain aspects of the invention. This diagram illustrates an example that considers a 2 bit/s/Hz 8 PSK multi-level LDPC coded modulation. Information bits (i.e., a bit sequence) is provided to a data partitioner 1310 that selectively provide the information bits to each of 3 different level encoders. The three level encoders are rate ½, rate ¾ and rate ¾ LDPC encoders, respectively. These encoders are shown pictorially as a rate ¾ LDPC encoder 1321, a rate ¾ LDPC encoder 1322, and a rate ½ LDPC encoder 1323. Each of the LDPC encoders outputs LDPC encoded bits that are all provided to a symbol mapper 1330. The symbol mapper 1330 outputs a sequence of discrete valued modulation symbols that is a MLC LDPC coded modulation signal that is mapped using a plurality of mappings; this is shown by signal sequence 1331 in the diagram.

By using these 3 individual encoders, the MLC code rate is ½+¾+¾=2. The block length of the code is N=21600. The MLC outputs 3 bit symbols with the LSB (Least Significant Bit) coming from the rate ½ LDPC encoder 1323 (i.e., the LSB is output from the first level encoder). The second level and the third level encoders are the same, and each has a code rate of ¾ (i.e., the rate ¾ LDPC encoder 1321 and the rate ¾ LDPC encoder 1322). The LDPC codes in this embodiment are irregular and have the bit degree properties indicated in FIG. 14. However, it is noted that regular LDPC codes could alternatively be employed in other embodiments without departing from the scope and spirit of the invention.

Figure 14:
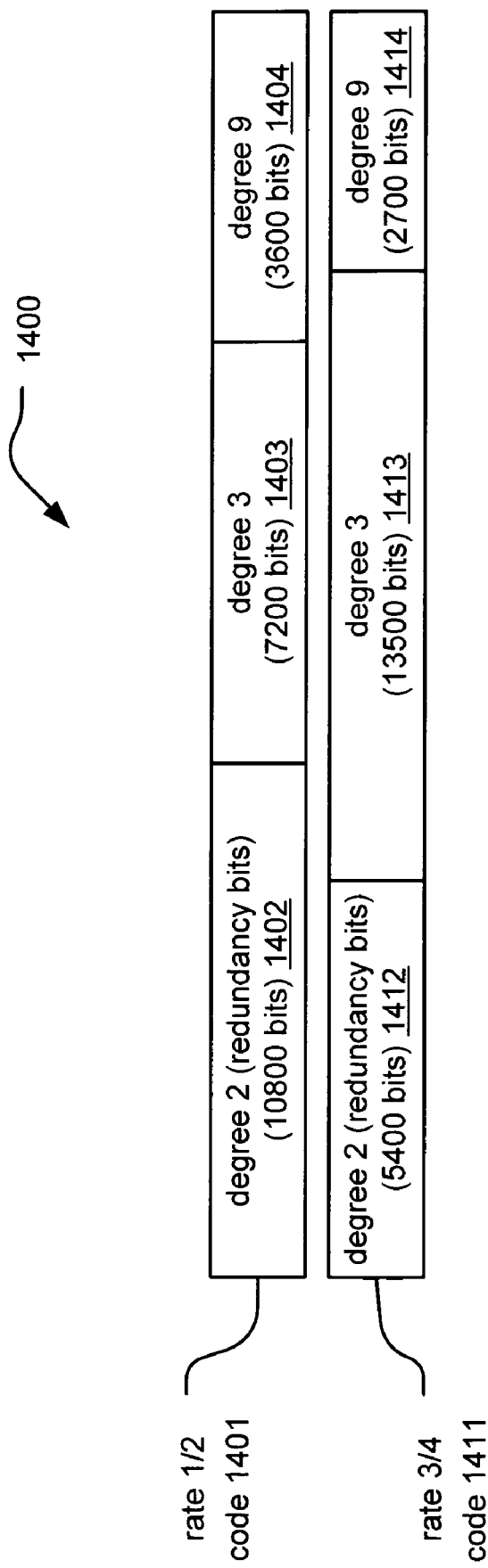
FIG. 14 is a diagram illustrating an embodiment of 2 irregular LDPC codes that may be employed in accordance certain aspects of the invention.

FIG. 14 is a diagram illustrating an embodiment of 2 irregular LDPC codes 1400 that may be employed in accordance with certain aspects of the invention. As mentioned above, regular LDPC codes could alternatively be employed. In this embodiment of 2 irregular LDPC codes 1400, there are a rate ½ code, shown by reference numeral 1401, and a rate ¾ code, shown by reference numeral 1412. Each of these LDPC codes includes degree 2 (redundancy bits), degree 3, and degree 9 bits.

The rate ½ code, shown by reference numeral 1401, includes 10800 degree 2 (redundancy bits) as shown by reference numeral 1402. This LDPC code also includes 7200 degree 3 bits as shown by reference numeral 1403 and 3600 degree 9 bits as shown by reference numeral 1404.

The rate ¾ code, shown by reference numeral 1411, includes 540 degree 2 (redundancy bits) as shown by reference numeral 1412. This LDPC code also includes 13500 degree 3 bits as shown by reference numeral 1413 and 2700 degree 9 bits as shown by reference numeral 1414.

Clearly, these two possible LDPC codes are illustrative of just two possible LDPC codes that could be employed in accordance with certain aspects of the invention. Other LDPC codes, including regular LDPC codes, could alternatively be employed.

Figure 15:
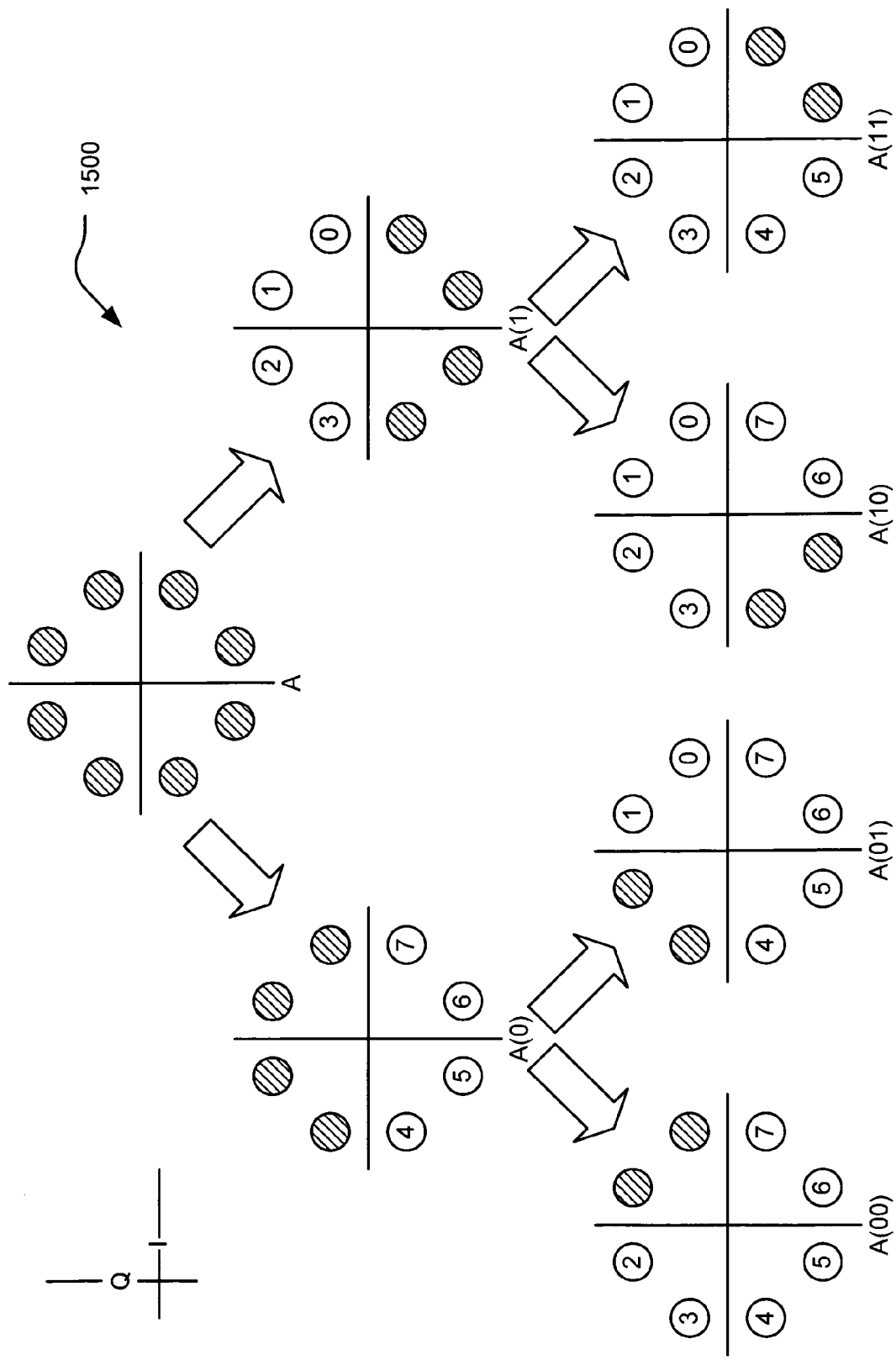
FIG. 15 is a diagram illustrating an embodiment of a partitioning tree of block partition that may be employed in accordance with certain aspects the invention.

FIG. 15 is a diagram illustrating an embodiment of a partitioning tree of block partition 1500 that may be employed in accordance with certain aspects of the invention. This diagram shows how the mapping may be achieved according to the strategy of BP (Block Partitioning).

With respect to this diagram, a designer starts with constructing a single mapping following the labeling strategy BP (Block Partitioning) as described in the Wachsmann reference (see citation referenced above) to arrive at the partitioning tree of block partition within the FIG. 15, where $A(0)=\{(0,a,b)|a,b\in\{0,1\}\}, A(1)=\{(1,a,b)|a,b\in\{0,1\}\},$ $A(00)=\{(0,0,a)|a\in\{0,1\}\}, A(01)=\{(0,1,a)|a\in\{0,1\}\}$ $A(10)=\{(1,0,a)|a\in\{0,1\}\},$ and $A(11)=\{(1,0,a)|a\in\{0,1\}\}.$ In FIG. 15, the symbols in the set corresponded to the constellation are mapped to the dots with cross-hatches. These corresponding mappings are denoted as map map(A (0)), map(A(1)), map(A(00)), map(A(01)), map(A(10)), and map(A(11)), and the signals correspond to the symbol set, respectively.

By using this approach, the minimum Euclidean distances of all these signal subsets are the same, and it is the minimum distance (i.e., $d_{min}$) of the signal constellation. The mapping corresponding to this partition (referred to as map SBP) is given in FIG. 16.

Figure 16:
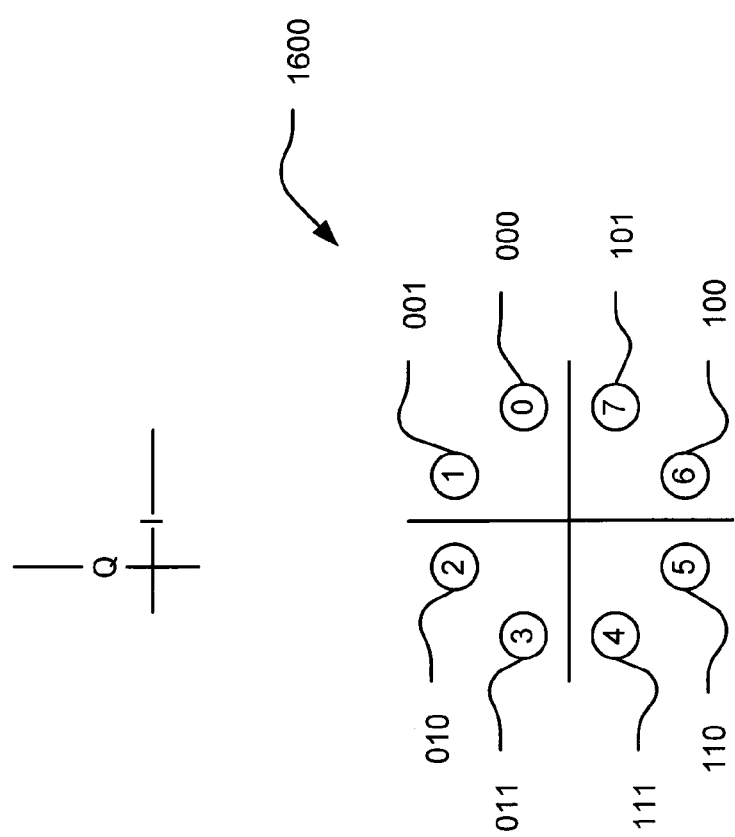
FIG. 16 is a diagram illustrating an embodiment of a map SBP, obtained from the block partition of FIG. 15, in accordance with certain aspects of the invention.

FIG. 16 is a diagram illustrating an embodiment of a map SBP 1600, obtained from the block partition of FIG. 15, in accordance with certain aspects of the invention. This diagram shows the actual mapping of the individual symbol values within the constellation. For example, there are 8 constellation points shown in this 8 PSK constellation shape, depicted as 0, 1, 2, 3, 4, 5, 6, 7, and 8 going counter-clockwise around the constellation points. The symbol mapping to each of these constellation points is provided as follows:

0=000 (binary) maps to constellation point depicted by 0 (000→0).

1=001 (binary) maps to constellation point depicted by 1 (001→1).

2=010 (binary) maps to constellation point depicted by 2 (010→2).

3=011 (binary) maps to constellation point depicted by 3 (011→3).

4=100 (binary) maps to constellation point depicted by 6 (100→6).

5=101 (binary) maps to constellation point depicted by 7 (101→7).

6=110 (binary) maps to constellation point depicted by 5 (110→5).

7=111 (binary) maps to constellation point depicted by 4 (111→4).

To have a multiple mapping system, the block (of length 21600) is divided into six parts, namely, P(0),P(1), ..., P(5). In one embodiment, the block (of length 21600) is evenly divided into six parts such that each of the sub-blocks, P(0),P(1), ..., P(5), is of equal length. Then, 4 maps are defined in FIG. 17. The symbol assignment is analogously made in accordance with the manner provided above with respect to the FIG. 16. The individual symbol mapping to each constellation point can be ascertained from the diagram.

Figure 17:
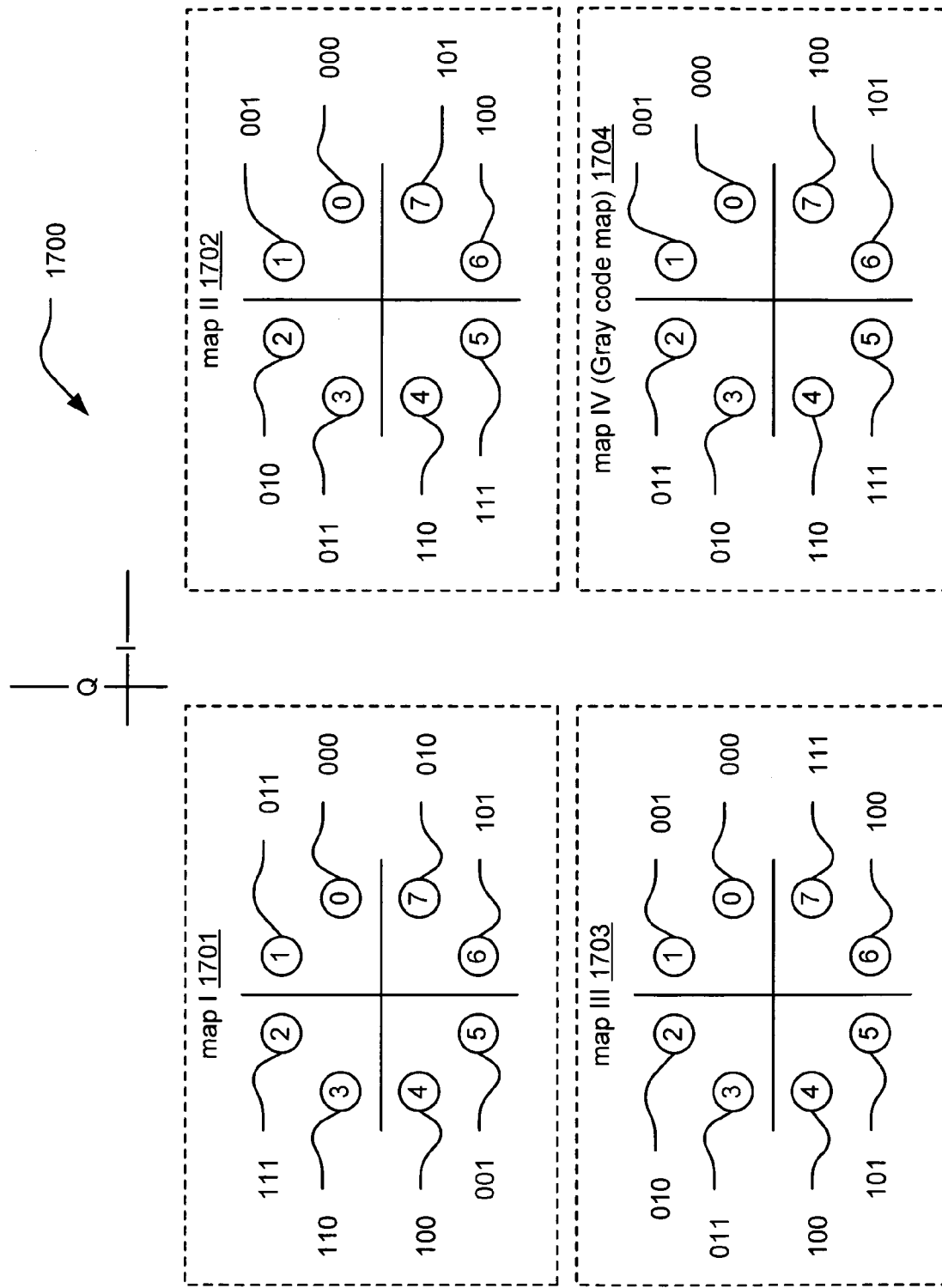
FIG. 17 is a diagram illustrating an embodiment of multiple maps that may be employed in accordance with certain aspects of the invention.

FIG. 17 is a diagram illustrating an embodiment of multiple maps 1700 that may be employed in accordance with certain aspects of the invention. These 4 maps may be referred to as map I (shown with reference numeral 1701), map II (shown with reference numeral 1702), map III (shown with reference numeral 1703), and map IV (shown with reference numeral 1704). Each of the map I, map II, map III, and map IV satisfy the BP (Block Partitioning) approach described above. Moreover, the MAP IV is a Gray code map.

These 4 maps are then assigned to appropriate parts of the divided MLC block. That is to say, each of these 4 maps is then assigned to the appropriate sub-block that has been generated from the divided MLC block.

For example, when considering a MLC block that has been divided into 6 parts (i.e., P(0),P(1), ..., P(5)), then map I is assigned to P(0), map II is assigned to P(1), map III is assigned to P(2) and P(3), and map IV is assigned to P(4) and P(5).

Clearly, other manners and approaches of assigning sub-blocks to individual mappings of a plurality of mappings may be performed without departing from the scope and spirit of the invention. This particular assignment of sub-blocks to these particular 4 mappings (i.e., map I, map II, map III, and map IV) is only one possible embodiment that may be performed in accordance with certain aspects of the invention.

Figure 18:
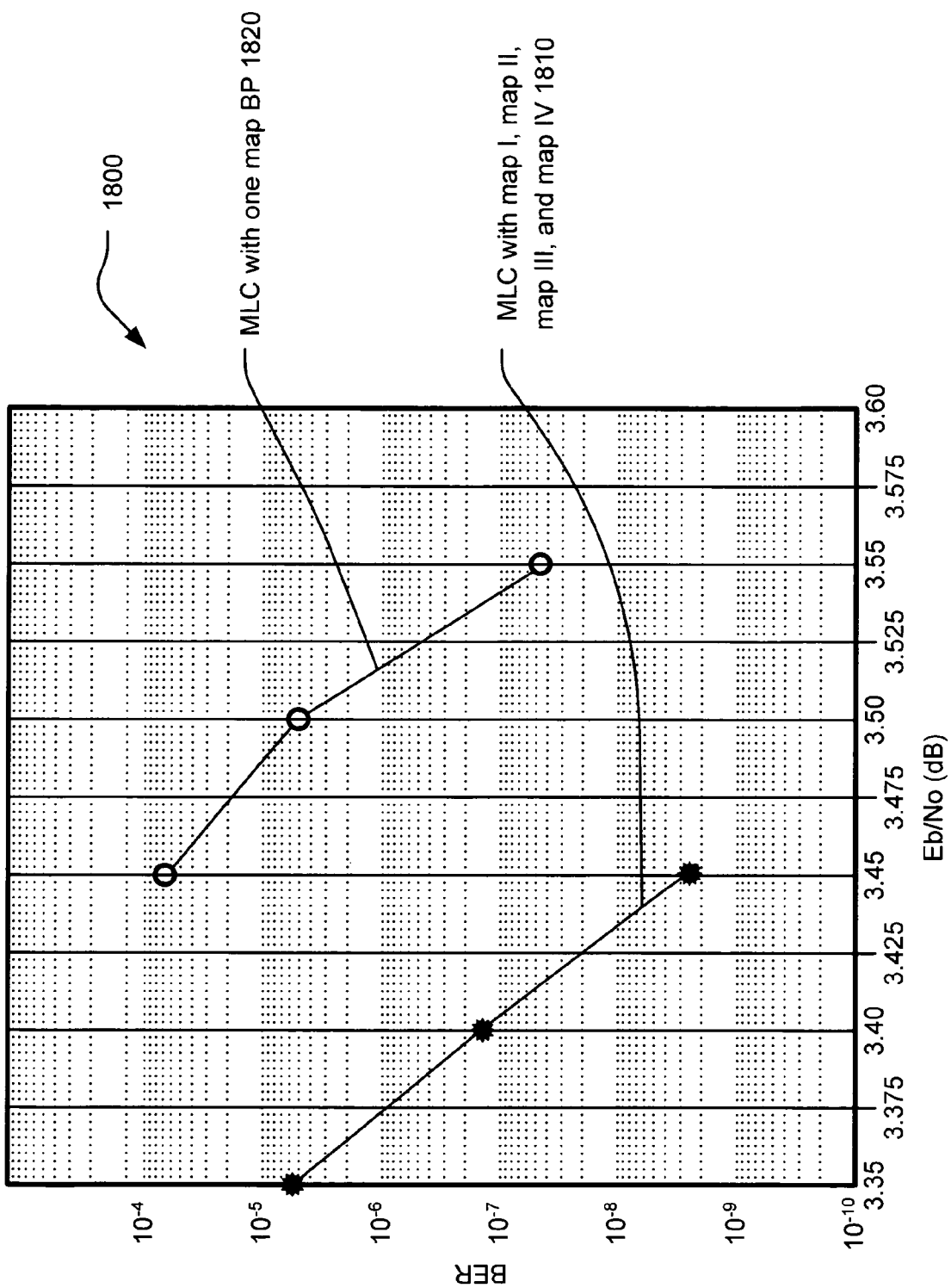
FIG. 18 is a diagram illustrating an embodiment of performance comparison of performance comparison of 2 bit/s/Hz 8 PSK MLC LDPC (Multi-Level Code Low Density Parity Check) signals according to the invention.

FIG. 18 is a diagram illustrating an embodiment of performance comparison of performance comparison 1800 of 2 bit/s/Hz 8 PSK (Phase Shift Key) MLC LDPC (Multi-Level Code Low Density Parity Check) signals according to the invention.

An IPHD (Iterative Parallel Hybrid Decoding) approach is applied to decode two different types of MLC LDPC signals, and their respective performance is compared in this diagram. This performance diagram is described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR) thereby providing a relatively concise representation of the performance of the decoding approach.

Each of these two different MLC LDPC signals has a different type of mapping. Using the IPHD approach, these two different mapping approaches are simulated and their performance is compared. The MLC LDPC signals use the multiple maps of map I, map II, map III, and map IV (reminder: map IV is a Gray code map), which is depicted with reference numeral 1810, is about 0.15 dB (decibels) better than the MLC LDPC signal that use a single map SBP, which is depicted with reference numeral 1820. As can be seen, the use of multiple mappings provided significantly lower BER at various values of $E_b/N_0$ (or SNR).

Figure 19:
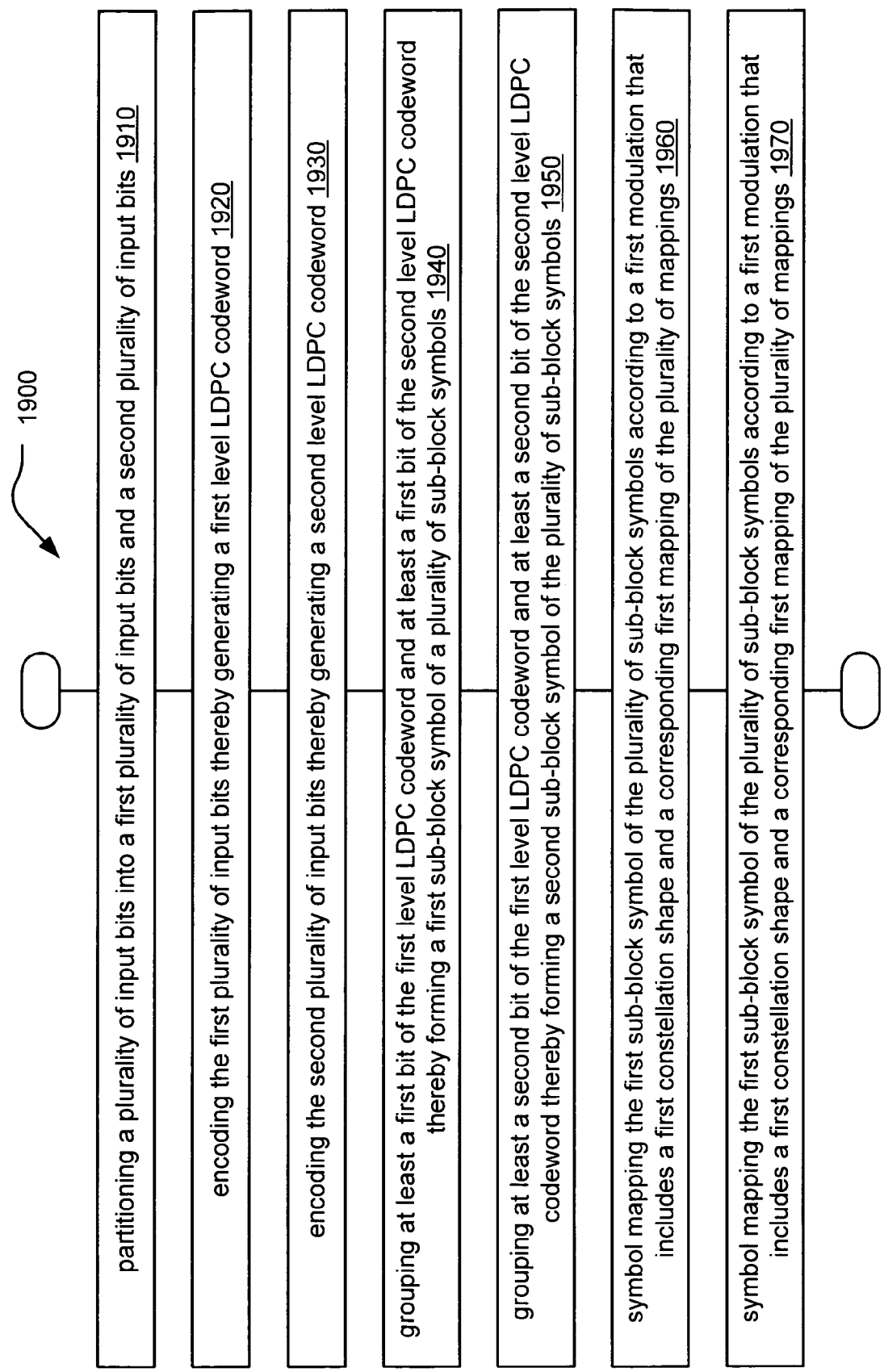
FIG. 19 is a flowchart illustrating an embodiment of a method for generating an MLC LDPC (Multi-Level Code Low Density Parity Check) coded modulation signal that is mapped using a plurality of mappings that may be performed according to certain aspects of the invention.

FIG. 19 is a flowchart illustrating an embodiment 1900 of a method for generating an MLC LDPC (Multi-Level Code Low Density Parity Check) coded modulation signal that is mapped using a plurality of mappings that may be performed according to certain aspects of the invention.

As shown in a block 1910, the method involves partitioning a plurality of input bits into a first plurality of input bits and a second plurality of input bits. Thereafter, the method involves encoding the first plurality of input bits thereby generating a first level LDPC codeword (as shown in a block 1920), and encoding the second plurality of input bits thereby generating a second level LDPC codeword (as shown in a block 1930).

The method also involves grouping at least a first bit of the first level LDPC codeword and at least a first bit of the second level LDPC codeword thereby forming a first sub-block symbol of a plurality of sub-block symbols, as shown in a block 1940. The method also involves grouping at least a second bit of the first level LDPC codeword and at least a second bit of the second level LDPC codeword thereby forming a second sub-block symbol of the plurality of sub-block symbols, as shown in a block 1950. In some instances, the operations within the blocks 1940 and 1950 may involves selecting only a single bit from each of the first level LDPC codeword and the second level LDPC codeword.

The method also involves symbol mapping the first sub-block symbol of the plurality of sub-block symbols according to a first modulation that includes a first constellation shape and a corresponding first mapping of the plurality of mappings, as shown in a block 1960. The method also involves symbol mapping the second sub-block symbol of the plurality of sub-block symbols according to a second modulation that includes a second constellation shape and a corresponding second mapping of the plurality of mappings, as shown in a block 1970. The symbol mapping operations performed within the blocks 1960 and 1970 may be viewed as performing mapping of a MLC LDPC signals using multiple mappings.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. An apparatus,
   a data partitioner that is operable to partition a plurality of input bits into a first plurality of input bits and a second plurality of input bits;
   a first LDPC (Low Density Parity Check) encoder that is operable to encode the first plurality of input bits thereby generating a first level LDPC codeword;
   a second LDPC encoder that is operable to encode the second plurality of input bits thereby generating a second level LDPC codeword;
   a symbol mapper that is operable to:
      group at least a first bit of the first level LDPC codeword and at least a first bit of the second level LDPC codeword thereby forming a first sub-block symbol of a plurality of sub-block symbols;
      group at least a second bit of the first level LDPC codeword and at least a second bit of the second level LDPC codeword thereby forming a second sub-block symbol of the plurality of sub-block symbols;
      symbol map the first sub-block symbol of the plurality of sub-block symbols according to a first modulation that includes a first constellation shape and a corresponding first mapping of the plurality of mappings;
      symbol map the second sub-block symbol of the plurality of sub-block symbols according to a second modulation that includes a second constellation shape and a corresponding second mapping of the plurality of mappings; and
      output an MLC LDPC (Multi-Level Code Low Density Parity Check) coded modulation signal, being a sequence of discrete-valued modulation symbols that is mapped using a plurality of mappings, that includes the symbol mapped first sub-block symbol and the symbol mapped second sub-block symbol.

2. The apparatus of claim 1, wherein:
   at least one of the corresponding first mapping of the plurality of mappings and the corresponding second mapping of the plurality of mappings is a Gray code mapping.

3. The apparatus of claim 1, wherein:
   the first LDPC encoder is operable to encode the first plurality of input bits using a first code rate LDPC code thereby generating the first level LDPC codeword; and
   the second LDPC encoder is operable to encode the second plurality of input bits using a second code rate LDPC code thereby generating the second level LDPC codeword.

4. The apparatus of claim 3, wherein:
   at least one of the first code rate LDPC code and the second code rate LDPC code is an irregular LDPC code.

5. The apparatus of claim 3, wherein:
   at least one of the first code rate LDPC code and the second code rate LDPC code is a regular LDPC code.

6. The apparatus of claim 3, wherein:
   the MLC LDPC coded modulation signal has an MLC LDPC code rate that is a sum of a first code rate of the first code rate LDPC code and a second code rate of the second code rate LDPC code.

7. The apparatus of claim 1, further comprising a clock counter and a map selector wherein:
   the clock counter is operable to provide a clock signal having clock cycles;
   the map selector is operable to:
      receive the clock signal from the clock counter;
      provide a first selected mapping to the symbol mapper during a first clock cycle of the clock signal;
      provide a second selected mapping to the symbol mapper during a second clock cycle of the clock signal; and
   the symbol mapper is operable to employ at least one of the first selected mapping and the second selected mapping as at least one of the first mapping of the plurality of mappings and the second mapping of the plurality of mappings.

8. The apparatus of claim 1, wherein:
   the symbol mapper is operable to:
      symbol map the first sub-block symbol of the plurality of sub-block symbols according to the first modulation that includes the first constellation shape and the corresponding first mapping of the plurality of mappings during a first clock cycle of a clock signal; and
      symbol map the second sub-block symbol of the plurality of sub-block symbols according to the second modulation that includes the second constellation shape and the corresponding second mapping of the plurality of mappings during a second clock cycle of a clock signal.

9. The apparatus of claim 1, wherein:
   the first LDPC encoder is operable to encode the first plurality of input bits using a code rate ½ LDPC code thereby generating the first level LDPC codeword; and
   the second LDPC encoder is operable to encode the second plurality of input bits using a code rate ¾ LDPC code thereby generating the second level LDPC codeword.

10. The apparatus of claim 1, wherein:
    the first level LDPC codeword and the second level LDPC codeword form a block;
    the block is evenly divided into a plurality of sub-blocks;
    the first sub-block symbol of the plurality of sub-block symbols is included within a first sub-block of the plurality of sub-blocks; and
    the second sub-block symbol of the plurality of sub-block symbols is included within the second sub-block of the plurality of sub-blocks.

11. The apparatus of claim 1, wherein:
    the first constellation shape is an 8 PSK (Phase Shift Key) constellation shape; and
    the second constellation shape is the 8 PSK constellation shape.

12. The apparatus, comprising:
a data partitioner that is operable to partition a plurality of input bits into a first plurality of input bits and a second plurality of input bits;
a first LDPC (Low Density Parity Check) encoder that is operable to encode the first plurality of input bits using a first code rate LDPC code thereby generating a first level LDPC codeword;
a second LDPC encoder that is operable to encode the second plurality of input bits using a second code rate LDPC code thereby generating a second level LDPC codeword;
a symbol mapper that is operable to:
  group at least a first bit of the first level LDPC codeword and at least a first bit of the second level LDPC codeword thereby forming a first sub-block symbol of a plurality of sub-block symbols;
  group at least a second bit of the first level LDPC codeword and at least a second bit of the second level LDPC codeword thereby forming a second sub-block symbol of the plurality of sub-block symbols;
  symbol map the first sub-block symbol of the plurality of sub-block symbols according to a first modulation that includes a first constellation shape and a corresponding first mapping of the plurality of mappings;
  symbol map the second sub-block symbol of the plurality of sub-block symbols according to a second modulation that includes a second constellation shape and a corresponding second mapping of the plurality of mappings; and
  output an MLC LDPC (Multi-Level Code Low Density Parity Check) coded modulation signal, being a sequence of discrete-valued modulation symbols that is mapped using a plurality of mappings, that includes the symbol mapped first sub-block symbol and the symbol mapped second sub-block symbol;
a clock counter that is operable to provide a clock signal having clock cycles;
a map selector that is operable to:
  receive the clock signal from the clock counter;
  provide a first selected mapping to the symbol mapper during a first clock cycle of the clock signal;
  provide a second selected mapping to the symbol mapper during a second clock cycle of the clock signal; and
  wherein the symbol mapper is operable to employ at least one of the first selected mapping and the second selected mapping as at least one of the first mapping of the plurality of mappings and the second mapping of the plurality of mappings.

13. A method, comprising:
partitioning a plurality of input bits into a first plurality of input bits and a second plurality of input bits;
encoding the first plurality of input bits thereby generating a first level LDPC codeword;
encoding the second plurality of input bits thereby generating a second level LDPC codeword;
grouping at least a first bit of the first level LDPC codeword and at least a first bit of the second level LDPC codeword thereby forming a first sub-block symbol of a plurality of sub-block symbols;
grouping at least a second bit of the first level LDPC codeword and at least a second bit of the second level LDPC codeword thereby forming a second sub-block symbol of the plurality of sub-block symbols;
symbol mapping the first sub-block symbol of the plurality of sub-block symbols according to a first modulation that includes a first constellation shape and a corresponding first mapping of the plurality of mappings;
symbol mapping the second sub-block symbol of the plurality of sub-block symbols according to a second modulation that includes a second constellation shape and a corresponding second mapping of the plurality of mappings; and
forming an MLC LDPC (Multi-Level Code Low Density Parity Check) coded modulation signal, being a sequence of discrete-valued modulation symbols that is mapped using a plurality of mappings, that includes the symbol mapped first sub-block symbol and the symbol mapped second sub-block symbol;
processing the MLC LDPC coded modulation signal, if needed, so that it comports with a communication channel;
launching the MLC LDPC coded modulation signal into the communication channel.

14. The method of claim 13, wherein:
at least one of the corresponding first mapping of the plurality of mappings and the corresponding second mapping of the plurality of mappings is a Gray code mapping.

15. The method of claim 13, further comprising:
encoding the first plurality of input bits using a first code rate LDPC code thereby generating the first level LDPC codeword; and
encoding the second plurality of input bits using a second code rate LDPC code thereby generating the second level LDPC codeword.

16. The method of claim 15, wherein:
at least one of the first code rate LDPC code and the second code rate LDPC code is an irregular LDPC code.

17. The method of claim 15, wherein:
at least one of the first code rate LDPC code and the second code rate LDPC code is a regular LDPC code.

18. The method of claim 15, wherein:
the MLC LDPC coded modulation signal has an MLC LDPC code rate that is a sum of a first code rate of the first code rate LDPC code and a second code rate of the second code rate LDPC code.

19. The method of claim 13, further comprising:
providing a clock signal having clock cycles;
providing a first selected mapping during a first clock cycle of the clock signal;
providing a second selected mapping during a second clock cycle of the clock signal; and
employing at least one of the first selected mapping and the second selected mapping as at least one of the first mapping of the plurality of mappings and the second mapping of the plurality of mappings.

20. The method of claim 13, further comprising:
symbol mapping the first sub-block symbol of the plurality of sub-block symbols according to the first modulation that includes the first constellation shape and the corresponding first mapping of the plurality of mappings during a first clock cycle of a clock signal; and
symbol mapping the second sub-block symbol of the plurality of sub-block symbols according to the second modulation that includes the second constellation shape and the corresponding second mapping of the plurality of mappings during a second clock cycle of a clock signal.

21. The method of claim 13, further comprising:

encoding the first plurality of input bits using a code rate ½ LDPC code thereby generating the first level LDPC codeword; and encoding the second plurality of input bits using a code rate ¾ LDPC code thereby generating the second level LDPC codeword.

22. The method of claim 13, further comprising:

forming a block with the first level LDPC codeword and the second level LDPC codeword;

evenly dividing the block into a plurality of sub-blocks;

including the first sub-block symbol of the plurality of sub-block symbols within a first sub-block of the plurality of sub-blocks; and including the second sub-block symbol of the plurality of sub-block symbols within the second sub-block of the plurality of sub-blocks.

23. The method of claim 13, wherein:

the first constellation shape is an 8 PSK (Phase Shift Key) constellation shape; and the second constellation shape is the 8 PSK constellation shape.

* * * * *

UNITED STATES PATENT AND TRADEMARK OFFICE
CERTIFICATE OF CORRECTION

PATENT NO. : 7,197,690 B2 Page 1 of 1
APPLICATION NO. : 11/017087
DATED : March 27, 2007
INVENTOR(S) : Ba-Zhong Shen et al.

It is certified that error appears in the above-identified patent and that said Letters Patent is hereby corrected as shown below:

Column 1, line 60: replace "2002)." with --2002.--

Column 23, line 21, in Claim 1: after "apparatus," insert --comprising:--

Signed and Sealed this

Eighth Day of July, 2008

JON W. DUDAS
*Director of the United States Patent and Trademark Office*